United States Patent
Hasegawa et al.

(10) Patent No.: US 7,200,828 B2
(45) Date of Patent: Apr. 3, 2007

(54) AUTOMATIC PLACEMENT AND ROUTING APPARATUS AND AUTOMATIC PLACEMENT AND ROUTING METHOD

(75) Inventors: Norimichi Hasegawa, Hyogo (JP); Nobuhide Naritomi, Hyogo (JP); Yutaka Kamakura, Hyogo (JP)

(73) Assignees: Renesas Technology Corp., Tokyo (JP); Renesas LSI Design Corporation, Hyogo (JP)

( * ) Notice: Subject to any disclaimer, the term of this patent is extended or adjusted under 35 U.S.C. 154(b) by 120 days.

(21) Appl. No.: 10/940,767

(22) Filed: Sep. 15, 2004

(65) Prior Publication Data

US 2005/0060678 A1   Mar. 17, 2005

(30) Foreign Application Priority Data

Sep. 16, 2003   (JP)   ............................. 2003-322635

(51) Int. Cl.
*G06F 17/50* (2006.01)

(52) U.S. Cl. .......................................... 716/10; 716/12

(58) Field of Classification Search ............... 716/8–14
See application file for complete search history.

(56) References Cited

U.S. PATENT DOCUMENTS

| | | | |
|---|---|---|---|
| 5,666,288 A * | 9/1997 | Jones et al. | 716/17 |
| 7,007,257 B2 * | 2/2006 | Tanaka | 716/9 |
| 2002/0010901 A1 * | 1/2002 | Otaguro | 716/12 |
| 2003/0084418 A1 * | 5/2003 | Regan | 716/14 |

FOREIGN PATENT DOCUMENTS

JP   2001-210717   8/2001

\* cited by examiner

*Primary Examiner*—Vuthe Siek
*Assistant Examiner*—Binh Tat
(74) *Attorney, Agent, or Firm*—McDermott Will & Emery LLP

(57) ABSTRACT

A replacement cell determining part is configured so as not to handle, as a cell that should be replaced, the case where the sole difference is the cell identification name and other data are matched, in addition to the case where all of the cell identification name, the cell type name, the pin name of the cell, and the signal name assigned to the pin are matched. A rerouting signal determining part is configured so as not to handle, as a signal that should be rerouted, the case where the sole difference is the signal name and other data are matched, in addition to the case where all of the signal name, the pin name to which the signal is applied, the cell identification name of a cell possessed by the pin, and the cell type name of the cell are matched.

6 Claims, 20 Drawing Sheets

F I G. 1
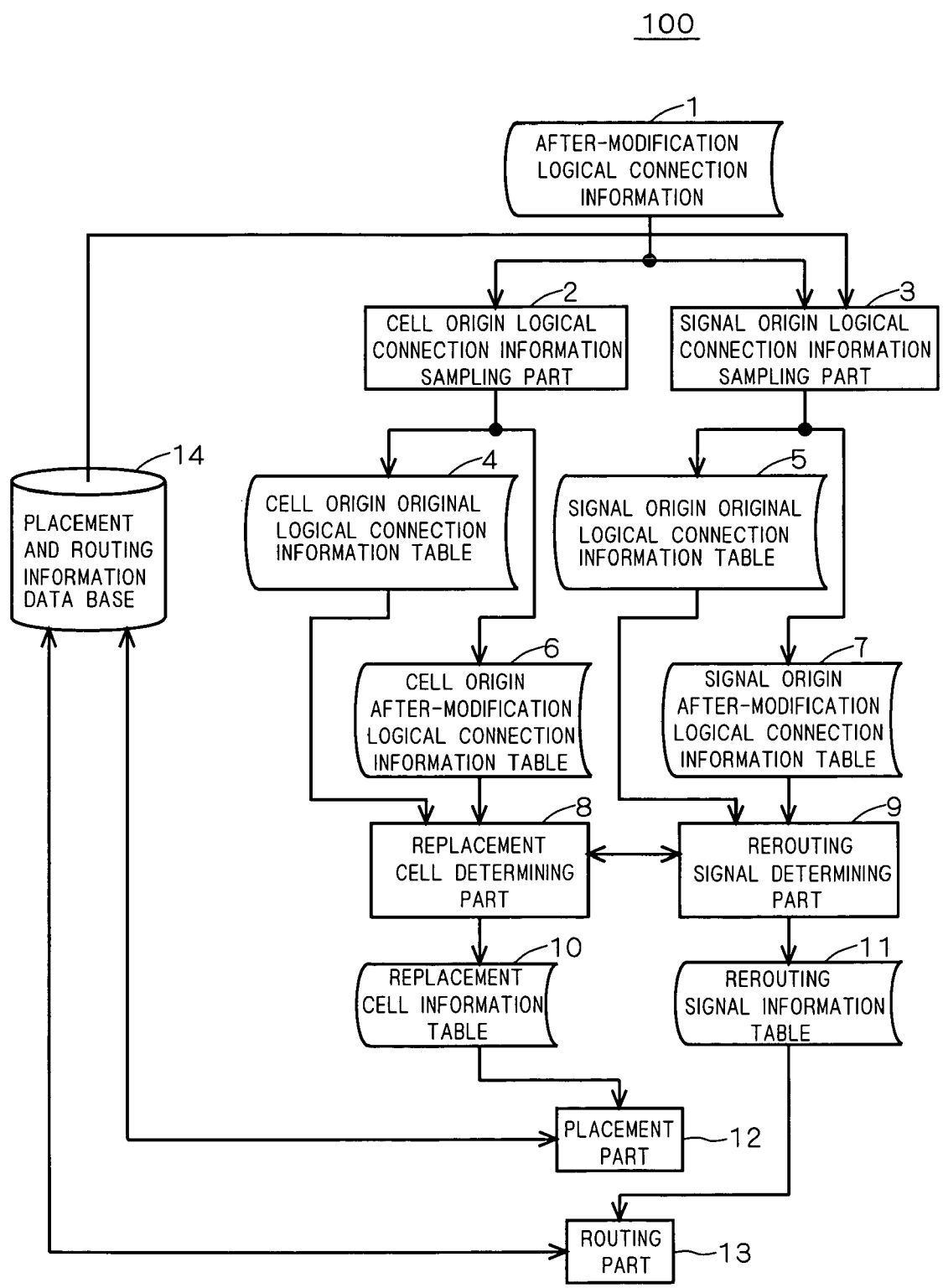

F I G. 3
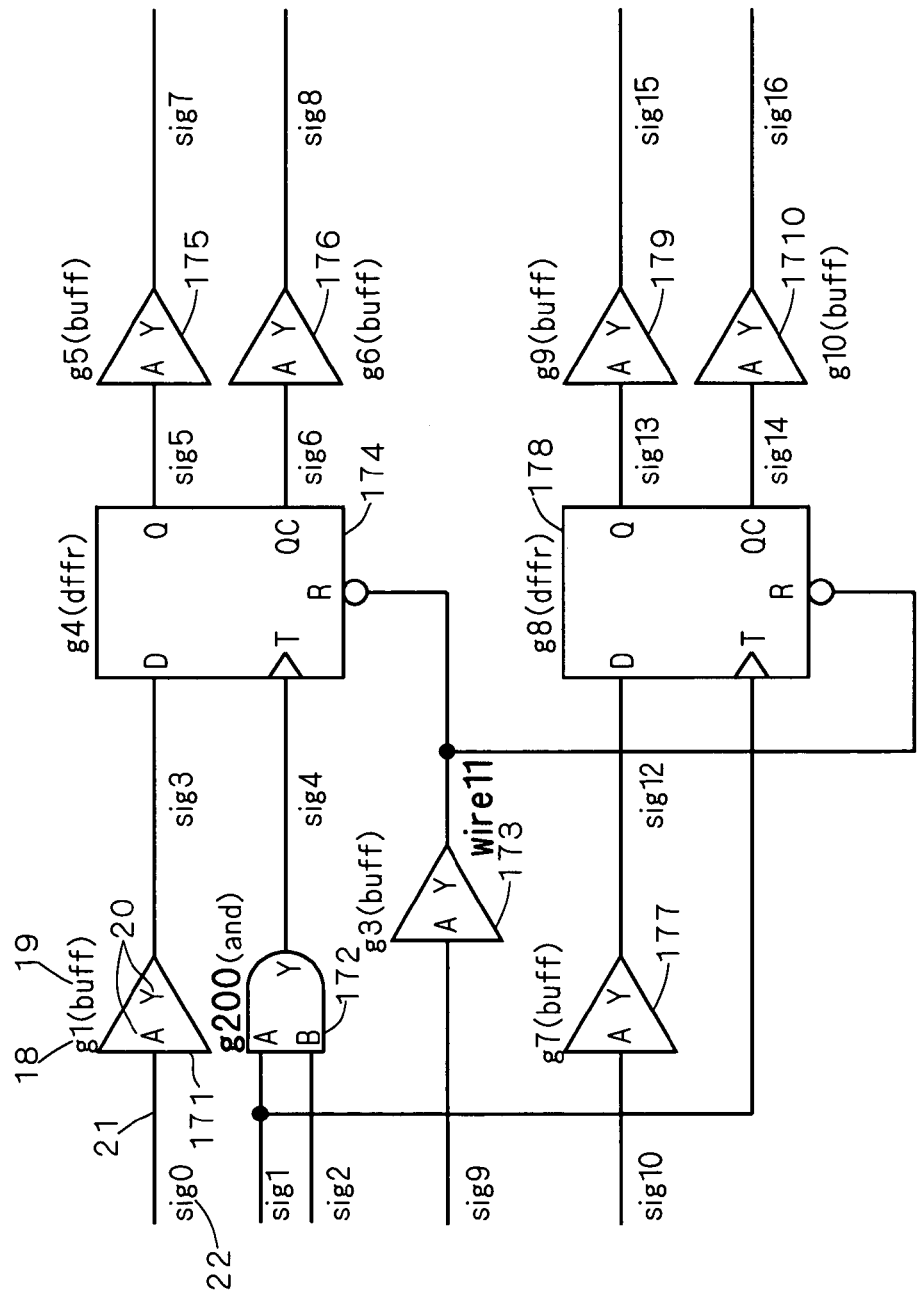

| CELL IDENTIFICATION NAME | CELL TYPE NAME | PIN NAME | SIGNAL NAME |
|---|---|---|---|
| g1 | buff | A | sig0 |
| | | Y | sig3 |
| g2 | and | A | sig1 |
| | | B | sig2 |
| | | Y | sig4 |
| g3 | buff | A | sig9 |
| | | Y | sig11 |
| g4 | dffr | D | sig3 |
| | | T | sig4 |
| | | R | sig11 |
| | | Q | sig5 |
| | | QC | sig6 |
| g5 | buff | A | sig5 |
| | | Y | sig7 |
| g6 | buff | A | sig6 |
| | | Y | sig8 |
| g7 | buff | A | sig10 |
| | | Y | sig12 |
| g8 | dffr | D | sig12 |
| | | T | sig1 |
| | | R | sig11 |
| | | Q | sig13 |
| | | QC | sig14 |
| g9 | buff | A | sig13 |
| | | Y | sig15 |
| g10 | buff | A | sig14 |
| | | Y | sig16 |

FIG. 8

| CELL IDENTIFICATION NAME | CELL TYPE NAME | PIN NAME | SIGNAL NAME |
|---|---|---|---|
| g1 | buff | A | sig0 |
| | | Y | sig3 |
| g200 | and | A | sig1 |
| | | B | sig2 |
| | | Y | sig4 |
| g3 | buff | A | sig9 |
| | | Y | wire11 |
| g4 | dffr | D | sig3 |
| | | T | sig4 |
| | | R | wire11 |
| | | Q | sig5 |
| | | QC | sig6 |
| g5 | buff | A | sig5 |
| | | Y | sig7 |
| g6 | buff | A | sig6 |
| | | Y | sig8 |
| g7 | buff | A | sig10 |
| | | Y | sig12 |
| g8 | dffr | D | sig12 |
| | | T | sig1 |
| | | R | wire11 |
| | | Q | sig13 |
| | | QC | sig14 |
| g9 | buff | A | sig13 |
| | | Y | sig15 |
| g10 | buff | A | sig14 |
| | | Y | sig16 |

| SIGNAL NAME | PIN NAME | CELL IDENTIFICATION NAME | CELL TYPE NAME |
| --- | --- | --- | --- |
| sig0 | A | g1 | buff |
| sig1 | A | g2 | and |
| | T | g8 | dffr |
| sig2 | B | g2 | and |
| sig3 | Y | g1 | buff |
| | D | g4 | dffr |
| sig4 | Y | g2 | and |
| | T | g4 | dffr |
| sig5 | Q | g4 | dffr |
| | A | g5 | buff |
| sig6 | QC | g4 | dffr |
| | A | g6 | buff |
| sig7 | Y | g5 | buff |
| sig8 | Y | g6 | buff |
| sig9 | A | g3 | buff |
| sig10 | A | g7 | buff |
| sig11 | Y | g3 | buff |
| | R | g4 | dffr |
| | R | g8 | dffr |
| sig12 | Y | g7 | buff |
| | D | g8 | dffr |
| sig13 | Q | g8 | dffr |
| | A | g9 | buff |
| sig14 | QC | g8 | dffr |
| | A | g10 | buff |

| SIGNAL NAME | PIN NAME | CELL IDENTIFICATION NAME | CELL TYPE NAME |
| --- | --- | --- | --- |
| sig0 | A | g1 | buff |
| sig1 | A | g200 | and |
| | T | g8 | dffr |
| sig2 | B | g200 | and |
| sig3 | Y | g1 | buff |
| | D | g4 | dffr |
| sig4 | Y | g200 | and |
| | T | g4 | dffr |
| sig5 | Q | g4 | dffr |
| | A | g5 | buff |
| sig6 | QC | g4 | dffr |
| | A | g6 | buff |
| sig7 | Y | g5 | buff |
| sig8 | Y | g6 | buff |
| sig9 | A | g3 | buff |
| sig10 | A | g7 | buff |
| wire11 | Y | g3 | buff |
| | R | g4 | dffr |
| | R | g8 | dffr |
| sig12 | Y | g7 | buff |
| | D | g8 | dffr |
| sig13 | Q | g8 | dffr |
| | A | g9 | buff |
| sig14 | QC | g8 | dffr |
| | A | g10 | buff |

| CELL IDENTIFICATION NAME | CELL TYPE NAME | PIN NAME | SIGNAL NAME |
|---|---|---|---|
| g2 | and | A | sig1 |
| | | B | sig2 |
| | | Y | sig4 |

| CELL IDENTIFICATION NAME | CELL TYPE NAME | PIN NAME | SIGNAL NAME |
|---|---|---|---|
| g200 | and | A | sig1 |
| | | B | sig2 |
| | | Y | sig4 |

| SIGNAL NAME | PIN NAME | CELL IDENTIFICATION NAME | CELL TYPE NAME |
|---|---|---|---|
| sig1 | A | g2 | and |
| sig2 | T | g8 | dffr |
|  | B | g2 | and |
| sig4 | Y | g2 | and |
|  | T | g4 | dffr |
| sig11 | Y | g3 | buff |
|  | R | g4 | dffr |
|  | R | g8 | dffr |

| SIGNAL NAME | INPUT-OUTPUT PIN NAME | CELL IDENTIFICATION NAME | CELL TYPE NAME |
|---|---|---|---|
| sig1 | A | g200 | and |
| sig2 | T | g8 | dffr |
|  | B | g200 | and |
| sig4 | Y | g200 | and |
|  | T | g4 | dffr |
| wire11 | Y | g3 | buff |
|  | R | g4 | dffr |
|  | R | g8 | dffr |

AUTOMATIC PLACEMENT AND ROUTING APPARATUS AND AUTOMATIC PLACEMENT AND ROUTING METHOD

BACKGROUND OF THE INVENTION

1. Field of the Invention

The present invention relates to an automatic placement and routing apparatus and an automatic placement and routing method. In particular, the invention relates to an automatic placement and routing apparatus and an automatic placement and routing method, with which when modification of logical connection becomes necessary after placement and routing, such modification can be made efficiently.

2. Description of the Background Art

In the manufacturing of a semiconductor device, when creating a mask layout pattern, placement of a plurality of cells (basic circuits) and preparation (wiring) of wiring pattern between cells are performed by automatic placement and routing on the basis of predetermined logical connection information, while modifications to the logical connection information may be needed after placement and routing. This necessitates replacement and rerouting.

Corrections to placement and routing should be avoided if possible. However, in such corrections, it is desirable to make them efficiently. For example, Japanese Patent Laid-Open No. 2001-210717 (the 9th to 15th columns, FIGS. 1 to 9) discloses the technique of reducing the number of manufacturing steps necessary for corrections to placement and routing from back annotation result by hierarchically forming a specific region.

General automatic placement and routing apparatuses often employ the configuration of executing replacement and rerouting to portions requiring no replacement and rerouting. This causes the problem of spending meaningless time for placement and routing, thus making the apparatuses less efficient.

There has also been the problem that unnecessary placement and routing varies the delay time of signals, and a path causing no timing error in the automatic placement and routing before modifying logical connection information becomes a path causing timing error in the automatic placement and routing after modifying the logical connection information.

SUMMARY OF THE INVENTION

It is an object of the present invention to provide an automatic placement and routing apparatus and an automatic placement and routing method, which reduce unnecessary replacement and rerouting thereby to permit efficient placement and routing, and also prevent the occurrence of timing error associated with replacement and rerouting.

According to the present invention, an automatic placement and routing apparatus for automatically performing placement and routing of a cell on the basis of logical connection information includes a cell origin logical connection information sampling part, a signal origin logical connection information sampling part, a replacement cell determining part, and a rerouting signal determining part. The cell origin logical connection information sampling part receives the after-modification logical connection information applied when the logical connection information is modified, and outputs cell origin logical connection information with the cell as an origin. The signal origin logical connection information sampling part receives after-modification logical connection information and outputs signal origin logical connection information with a signal applied to the routing as an origin. The replacement cell determining part receives the signal origin logical connection information and determines a replacement cell that should be replaced. The rerouting signal determining part receives the signal origin logical connection information and determines a rerouting signal that should be rerouted. The replacement cell determining part makes a comparison, in cell units, between the after-modification logical connection information and the logical connection information, and does not determine a comparison object cell as the replacement cell, if the sole difference is cell identification name. The rerouting signal determining part makes a comparison, in signal units, between the after-modification logical connection information and the logical connection information, and does not determine a comparison object signal as the rerouting signal, if the sole difference is signal name.

The replacement cell determining part does not determine a comparison object cell as a replacement cell, if the sole difference is cell identification name. The rerouting signal determining part does not determine a comparison object signal as a replacement cell, if the sole difference is signal name. Therefore, even if after the placement and routing based on logical connection information, logical connection information is modified and such modification requires cell replacement and rerouting between cells, at least sufficient replacement and rerouting is executable thereby to reduce unnecessary replacement and rerouting, thus permitting efficient placement and routing. Additionally, elimination of unnecessary replacement and rerouting avoids that the timing error associated with replacement and rerouting occurs at portions whose logical connection information is not modified.

According to the present invention, an automatic placement and routing method is to automatically perform placement and routing of a cell on the basis of logical connection information. The method includes making a comparison, in cell units, between the logical connection information and after-modification logical connection information applied when the logical connection information is modified, and does not handle a comparison object cell as a replacement cell, if the sole difference is cell identification name. The method includes making a comparison, in signal units, between after-modification logical connection information and the logical connection information, and does not handle a comparison object signal as a rerouting signal, if the sole difference is signal name.

A comparison between the logical connection information and after-modification logical connection information applied when the logical connection information is modified is made in cell units, and a comparison object cell is not handled as a replacement cell, if the sole difference is cell identification name. A comparison between the after-modification logical connection information and the logical connection information is made in signal units, and a comparison object signal is not handled as a rerouting signal, if the sole difference is signal name. Therefore, even if after the placement and routing based on logical connection information, the logical connection information is modified and such modification requires cell replacement and rerouting between cells, at least sufficient replacement and rerouting is executable thereby to reduce unnecessary replacement and rerouting, thus permitting efficient placement and routing. Additionally, elimination of unnecessary replacement and rerouting avoids that the timing error associated with replacement and rerouting occurs at portions whose logical connection information is not modified.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the configuration of an automatic placement and routing apparatus of a first preferred embodiment according to the present invention;

FIG. 3 is a diagram showing one example of after-modification logical connection information;

FIG. 7 is a diagram showing one example of cell origin original logical connection information tables;

FIG. 8 is a diagram showing one example of cell origin after-modification logical connection information tables;

FIG. 10 is a diagram showing one example of signal origin original logical connection information tables;

FIG. 11 is a diagram showing one example of signal origin after-modification logical connection information tables;

FIG. 19 is a diagram showing one example of cell origin original logical connection information tables;

FIG. 20 is a diagram showing one example of cell origin after-modification logical connection information tables;

FIG. 21 is a diagram showing one example of signal origin original logical connection information tables; and FIG. 22 is a diagram showing one example of signal origin after-modification logical connection information tables.

DESCRIPTION OF THE PREFERRED EMBODIMENTS

A. First Preferred Embodiment

A-1. Apparatus Configuration

Figure 2:
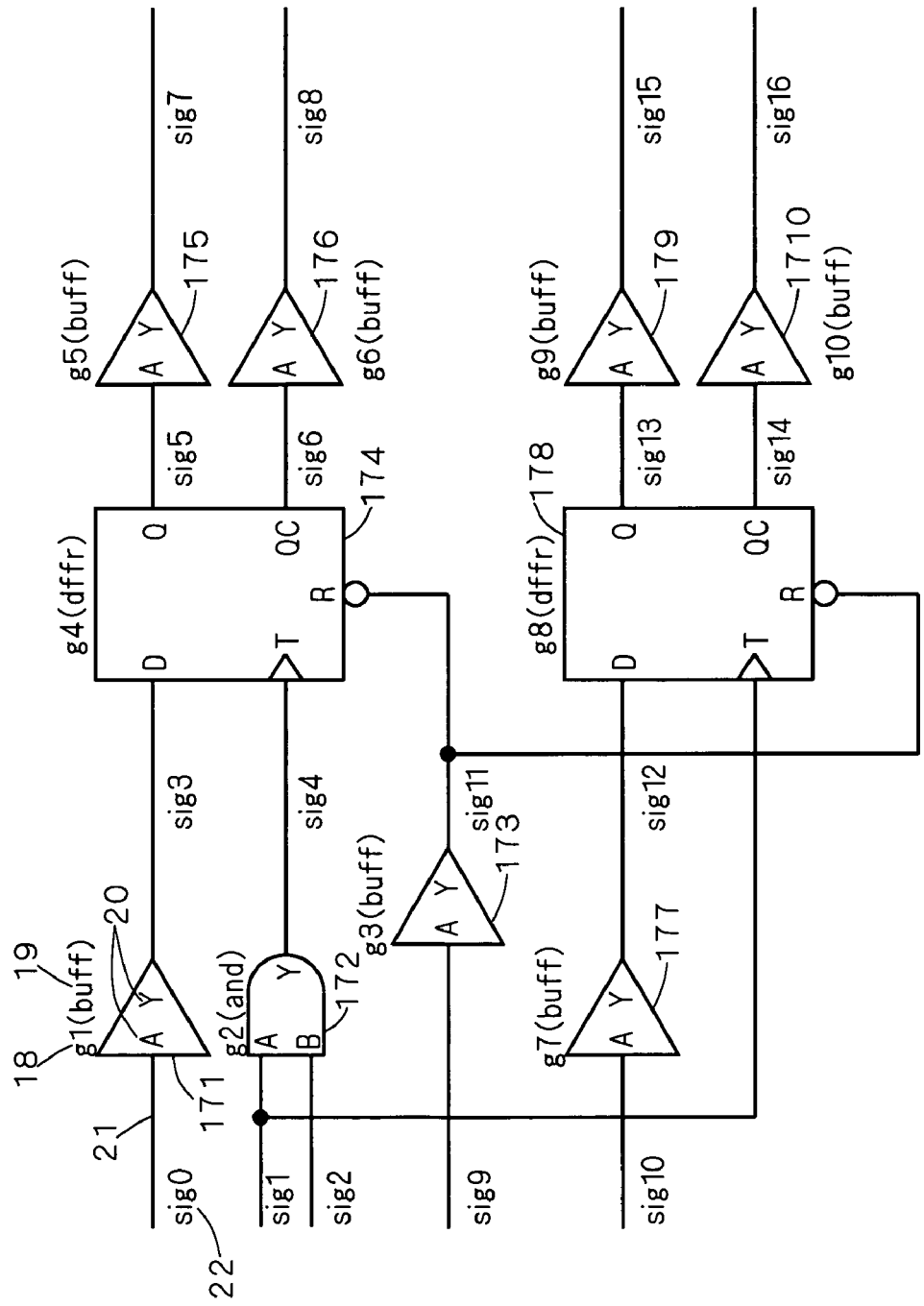
FIG. 2 is a diagram showing one example of before-modification logical connection information.

FIG. 1 is a block diagram showing the configuration of an automatic placement and routing apparatus in a first preferred embodiment according to the present invention.

Referring to FIG. 1, an automatic placement and routing apparatus 100 is an apparatus to perform automatic placement and routing on the basis of after-modification logical connection information 1, and the information of a placement and routing information data base 14 for storing information about placement and routing (including the original logical connection information prior to modification). The apparatus 100 has a cell origin logical connection information sampling part 2 for outputting logical connection information with a predetermined cell as the origin (the center), a signal origin logical connection information sampling part 3 for outputting logical connection information with a predetermined signal as the origin (the center), a replacement cell determining part 8, a rerouting signal determining part 9, a placement part 12, and a routing part 13.

The followings are the basic operations of the respective components.

The after-modification logical connection information 1, and the information of the placement and routing information data base 14 are supplied to the cell origin logical connection information sampling part 2 and the signal origin logical connection information sampling part 3. Then, the cell origin logical connection information sampling part 2 outputs a cell origin original logical connection information table 4 and a cell origin after-modification logical connection information table 6. The signal origin logical connection information sampling part 3 outputs a signal origin original logical connection information table 5 and a signal origin after-modification logical connection information table 7.

Then, the replacement cell determining part 8 reads the cell origin original logical connection information table 4 and the signal origin after-modification logical connection information table 6, and determines a cell that should be replaced, and then outputs a replacement cell information table 10.

The rerouting signal determining part 9 reads the signal origin original logical connection information table 5 and the signal origin after-modification logical connection information table 7, and determines a signal that should be rerouted, and then outputs a rerouting signal information table 11.

Here, the replacement cell determining part 8 and the rerouting signal determining part 9 are configured so as to supply their respective determination processing result information to each other, as will be described later.

The placement part 12 reads the information of the placement and routing information data base 14 and the replacement cell information table 10, and replaces only the cell having a cell identification name stored in the replacement cell information table 10, and then updates the placement and routing information of the placement and routing information data base 14.

The rerouting part 13 reads the information of the placement and routing information data base 14 and the rerouting signal information table 11, and reroutes only the signal having a signal name stored in the rerouting signal information table 11, and then updates the placement and routing information of the placement and routing information data base 14.

A-2. Apparatus Operation

Prior to the description of the operation of the automatic placement and routing apparatus 100, reference is made to FIG. 2 showing one example of before-modification original logical connection information, and FIG. 3 showing one example of after-modification logical connection information.

FIGS. 2 and 3 illustrate a configuration including, as a cell, buffers 171, 173, 175, 176, 177, 179 and 1710, an AND gate 172, and D-flip-flops 174 and 178.

Here, a cell identification name (instance name) 18 and a cell type name 19 are assigned to the cells 171, . . . , 1710, respectively, and a terminal name (hereinafter referred to as a "pin name") 20 is assigned to the terminals of respective cells. A signal name 22 is respectively assigned to a signal 21 that is given and received between the terminals of the respective cells.

Specifically, in FIG. 2, the cell identification names of the buffers 171, 173, 175, 176, 177, 179 and 1710 are g1, g3, g5, g6, g7, g9, and g10, respectively. Every cell type name is buff, every pin name of the input terminals is A, and every pin name of the output terminals is Y.

The cell identification name of the AND gate 172 is g2, its cell type name is "and", and the pin names of two input terminals are A and B, and the pin name of the output terminal is Y.

The cell identification names of the D-flip-flops 174 and 178 are "g4" and "g8", respectively; the cell type name is "dffr"; and the pin names of a data input terminal, a timing input terminal, a reset input terminal, an output terminal and an inverted output terminal are D, T, R, Q, and QC, respectively.

A signal applied to the input terminal A of the buffer 171 is designated as signal name "sig0", and a signal given and received between the output terminal Y of the buffer 171 and the data input terminal D of the D-flip-flop 174 is designated as signal name "sig3". A signal applied to the input terminal A of the AND gate 172 and the timing input terminal T of the D-flip-flop 178 is designated as signal name "sig1". A signal applied to the input terminal B of the AND gate 172 is designated as signal name "sig2". A signal given and received between the output terminal Y of the AND gate 172 and the timing input terminal T of the D-flip-flop 174 is designated as signal "sig4".

A signal given and received between the output terminal Q of the D-flip-flop 174 and the input terminal A of the buffer 175 is designated as signal name "sig5". A signal outputted from the output terminal Y of the buffer 175 is designated as signal name "sig7". A signal given and received between the inverted output terminal QC of the D-flip-flop 174 and the input terminal A of the buffer 176 is designated as signal name "sig6". A signal outputted from the output terminal Y of the buffer 176 is designated as signal name "sig8".

A signal applied to the input terminal A of the buffer 173 is designated as signal name "sig9". A signal given and received between the output terminal Y of the buffer 173 and the reset input terminals R of the D-flip-flop 174 and the D-flip-flop 178 is designated as signal name "sig11".

A signal applied to the input terminal A of the buffer 177 is designated as signal name "sig10". A signal given and received between the output terminal Y of the buffer 177 and the data input terminal D of the D-flip-flop 178 is designated as signal name "sig12".

A signal given and received between the output terminal Q of the D-flip-flop 178 and the input terminal A of the buffer 179 is designated as signal name "sig13". A signal outputted from the output terminal Y of the buffer 179 is designated as signal name "sig15". A signal given and received between the inverted output terminal of the D-flip-flop 178 and the input terminal A of the buffer 1710 is designated as signal name "sig14". A signal outputted from the output terminal Y of the buffer 1710 is designated as signal name "sig16".

The after-modification logical connection information shown in FIG. 3 is basically the same as the original logical connection information shown in FIG. 2, except that the cell identification name of the AND gate 172 is "g200", and that a signal given and received between the output terminal Y of the buffer 173 and the reset input terminals R of the D-flip-flop 174 and the D-flip-flop 178 is designated as signal name "wire11".

Figure 4:
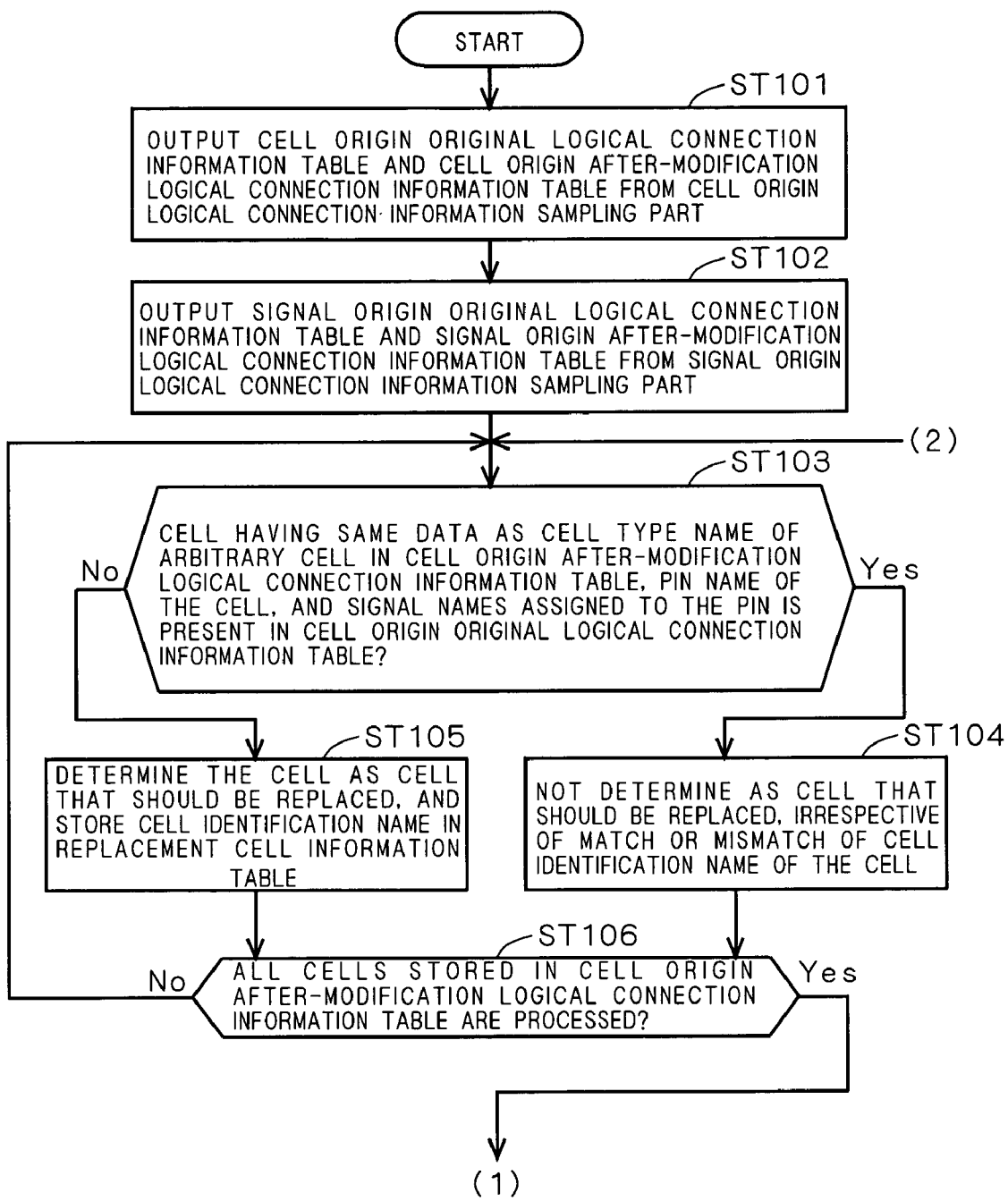
FIGS. 4 and 5 are flowcharts showing the operation of the automatic placement and routing apparatus of the first preferred embodiment.
Figure 5:
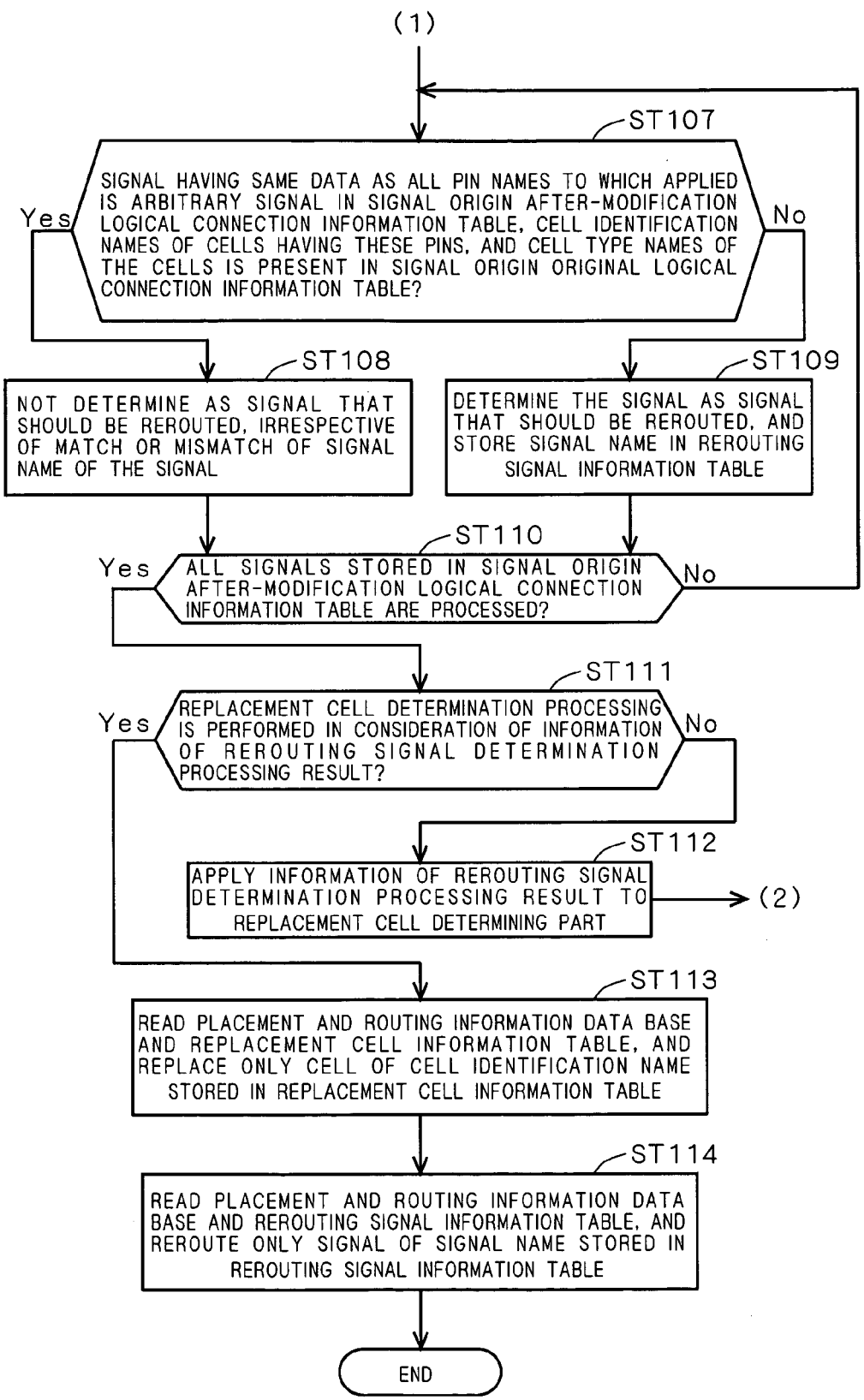

The replacement and rerouting operations of the automatic placement and routing apparatus 100 are now described by using the flowcharts shown in FIGS. 4 and 5. In FIGS. 4 and 5, a sequence of flow is divided for purposes of illustration, and the two are jointed to each other by the symbols (1) and (2).

When replacement and rerouting operations are started, first, in step ST101 shown in FIG. 4, the cell origin logical connection information sampling part 2 reads original logical connection information stored in the placement and routing information data base 14, and outputs the cell origin original logical connection information table 4. The sampling part 2 also reads the after-modification logical connection information 1, and outputs the cell origin after-modification logical connection information table 6.

Figure 6:
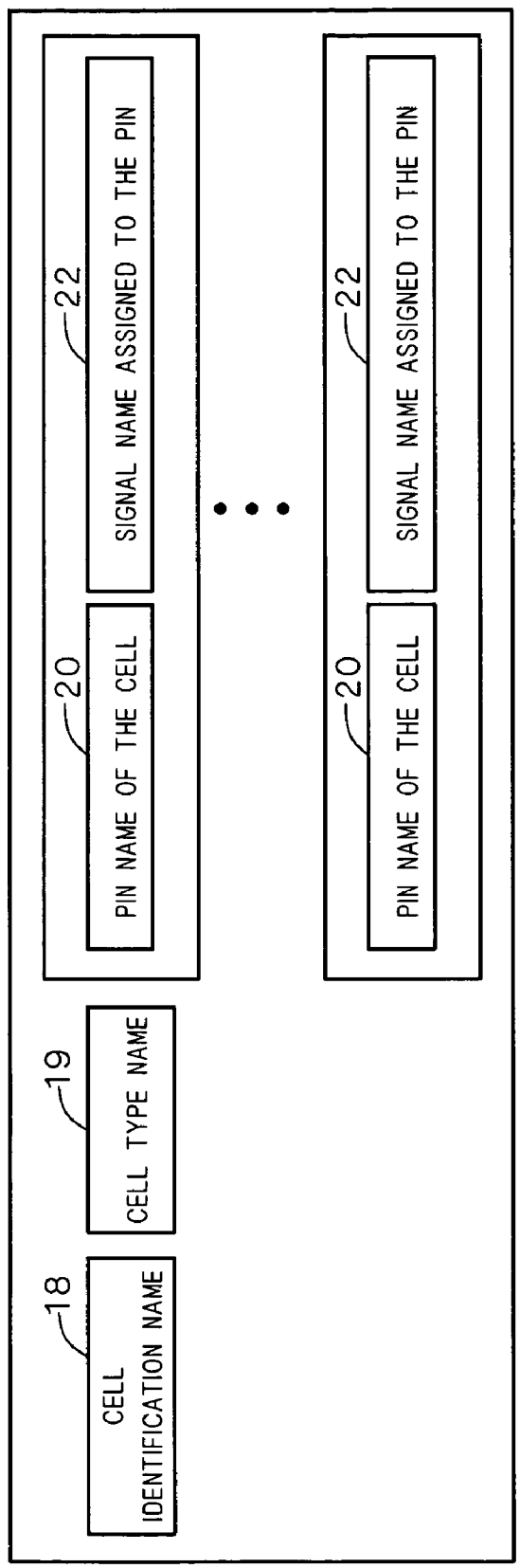
FIG. 6 is a diagram showing a cell origin logical connection information format.

Here, the cell origin original logical connection information table 4 and the cell origin after-modification logical connection information table 6 are created on the basis of a cell origin logical connection information format shown in FIG. 6. In other words, the cell origin logical connection information format of FIG. 6 is a format for arraying connection information with a cell as the origin (the center). Specifically, the information of a specific cell (i.e. a cell identification name 18 and a cell type name 19) is arrayed by associating per pin name 20 respective terminals (pins) contained in the cell, with a signal name 22 of a signal assigned to each of the respective pins.

Note that the data of the above-mentioned cell origin logical connection information are important data. Having these data be perfectly incorporated into the cell origin original logical connection information table 4 and the cell origin after-modification logical connection information table 6 allows for accurate determination processing in the replacement cell determining part 8.

Based on the above-mentioned cell origin logical connection information format, the original logical connection information shown in FIG. 2 is tabled to obtain the cell origin original logical connection information table 4 shown in FIG. 7. The after-modification logical connection information shown in FIG. 3 is tabled to obtain the cell origin after-modification logical connection information table 6 shown in FIG. 8.

Referring to FIG. 7, for example, cell identification name "g1" and cell type name "buff" in the uppermost column indicate that the signal of signal name sig0 is applied to the pin A of the buffer 171 in FIG. 2, and the signal of signal name sig3 is applied to the pin Y.

FIG. 8 is basically the same as FIG. 7, except for the cell identification name g200, the pin name Y of the cell having the cell identification name g3, the pin name R of the cell having the cell identification name g4, and the signal name wire11 assigned to the pin name R of the cell having the cell identification name g8.

Here, the cell identification name g200 is the cell identification name of the AND gate 172 in FIG. 3, and the signal name wire11 is the signal name of the signal given and received between the output terminal Y of the buffer 173 and the reset input terminals R of the D-flip-flop 174 and the D-flip-flop 178.

In the foregoing description, the cell origin logical connection information format of FIG. 6 is used to create the cell origin original logical connection information table 4 and the cell origin after-modification logical connection information table 6. This is cited merely by way of example and without limitation, but other format may be used.

Returning to FIG. 4, the description is now continued.

In step ST102, the signal origin logical connection information sampling part 3 reads the original logical connection information stored in the placement and routing information data base 14, and outputs the signal origin original logical connection information table 5. The sampling part 3 also reads the after-modification logical connection information 1, and outputs the signal origin after-modification logical connection information table 7.

Figure 9:
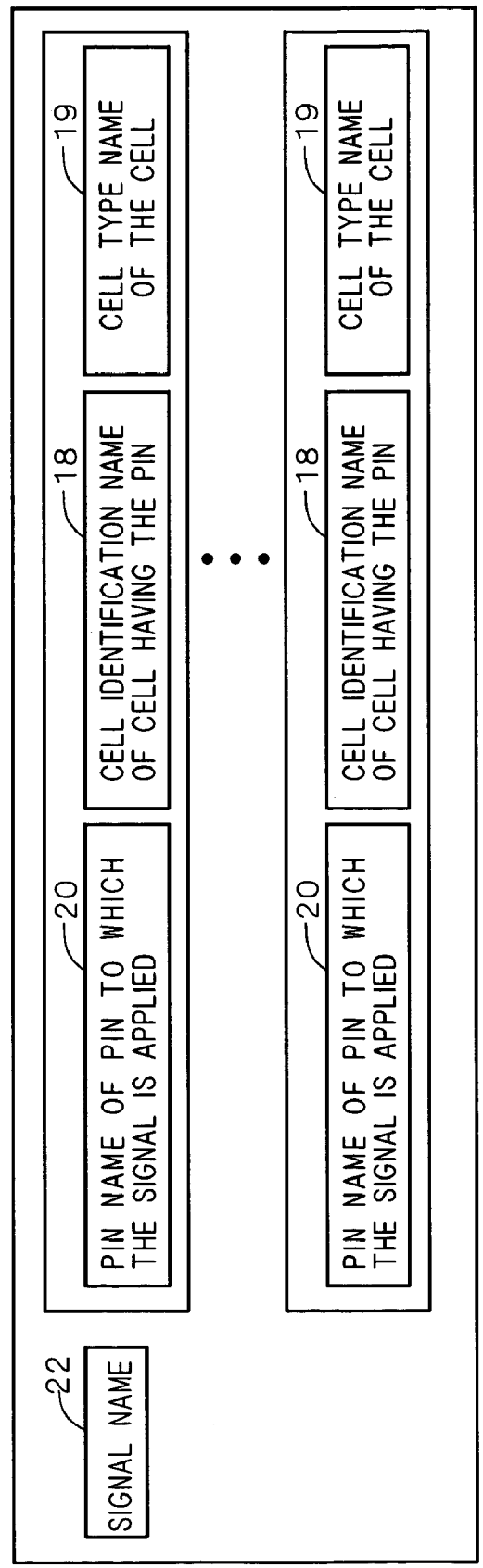
FIG. 9 is a diagram showing a signal origin logical connection information format.

Here, the signal origin original logical connection information table 5 and the signal origin after-modification logical connection information table 7 are created on the basis of a signal origin logical connection information format shown in FIG. 9. In other words, the signal origin logical connection information format of FIG. 9 is a format for arraying connection information with a signal as the origin (the center). Specifically, the information of a specific signal (i.e. a signal name 22) is arrayed by associating the pin name 20 of a terminal (pin) to which this signal is applied, and the information of a cell having this pin (i.e. a cell identification name 18 and a cell type name 19).

Note that the data of the above-mentioned signal origin logical connection information are important data. Having these data be perfectly incorporated into the signal origin original logical connection information table 5 and the signal origin after-modification logical connection information table 7 allows for accurate determination processing in the rerouting signal determining part 9.

Based on the above-mentioned signal origin logical connection information format, the original logical connection information shown in FIG. 2 is tabled to obtain the signal origin original logical connection information table 5 shown in FIG. 10. The after-modification logical connection information shown in FIG. 3 is tabled to obtain the signal origin after-modification logical connection information table 7 shown in FIG. 11.

Referring to FIG. 10, for example, signal name sig0, pin name A, cell identification name g1 and cell type name buff in the uppermost column indicate that in FIG. 2, the signal of signal name sig0 is applied to the pin A of the buffer 171 having the cell identification name g1.

FIG. 11 is basically the same as FIG. 10, except that the signal names sig1, sig2 and sig4 are applied to the pins of pin name A, pin name B and pin name Y in the cell of cell identification name 200, respectively. Further, the signal name sig11 in FIG. 10 is changed to signal name wire11.

In the foregoing description, the signal origin logical connection information format of FIG. 9 is used to create the signal origin original logical connection information table 5 and the signal origin after-modification logical connection information table 7. This is cited merely by way of example and without limitation, but other format may be used.

Returning to FIG. 4, the description is now continued.

Next, as shown in step ST103, the replacement cell determining part 8 reads the cell origin original logical connection information table 4 and the cell origin after-modification logical connection information table 6. Then, the determining part 8 reads out the data about the cell identification name 18 of a cell arbitrarily selected from the cell origin after-modification logical connection information table 6, the cell type name 19, the pin name 20 of a pin possessed by the cell, and the signal name 22 assigned to the pin, and then examines whether a cell having the same data as the cell type name 19, the pin name 20 and the signal name 22 is present in the cell origin original logical connection information table 4.

Relating to the signal name 22, although there are mismatches between the cell origin original logical connection information table 4 and the cell origin after-modification logical connection information table 6, as described later, the signal name 22, which is not determined as a signal that should be rerouted in the rerouting signal determining part 9, is handled as match in the replacement cell determining part 8.

This processing prevents replacement even of a cell, to which a signal that should be rerouted is not applied.

For example, in the case where the cells of cell identification names g3, g4 and g8 are selection cells as comparison objects, it is examined whether the data about the cell type name 19, the pin name 20 of a pin possessed by the cell, and the signal name 22 assigned to the pin in the cell origin after-modification logical connection information table 6 of FIG. 8, are present in the cell origin original logical connection information table 4. In this case, the cell origin after-modification logical connection information table 6 of FIG. 8 contains the signal name wire11, whereas FIG. 7 does not contain the signal name wire11. However, the rerouting signal determining part 9 does not determine the signal name wire11 as a signal that should be rerouted, so that the replacement cell determining part 8 determines it as the same signal.

Accordingly, relating to the cells of the cell identification names g3, g4 and g8 in the cell origin after-modification logical connection information table 6 of FIG. 8, the data about the cell type name 19, the pin name 20 of a pin possessed by the cell, and the signal name 22 assigned to the pin match the data in the cell origin original logical connection information table 4 of FIG. 7. This indicates the presence of a cell having the same data in the cell origin original logical connection information table 4.

In other case where the cell of cell identification name g200 in the cell origin after-modification logical connection information table 6 of FIG. 8 is a selection cell as a comparison object, the cell identification name g200 is not present in the cell origin original logical connection information table 4 of FIG. 7. However, the data about the cell of the cell identification name g200, the cell type name 19, the pin name 20 of a pin possessed by the cell, and the signal name 22 assigned to the pin match the data about the cell of cell identification name g2 in the cell origin original logical connection information table 4 of FIG. 7. This indicates the presence of a cell having the same data in the cell origin original logical connection information table 4.

If confirmed the presence of the cell in the cell origin original logical connection information table 4, which has the same data as the data about the cell type name 19 of a selection cell in the cell origin after-modification logical connection information table 6, the pin name 20 of a pin possessed by the cell, and the signal name 22 assigned to the pin, the replacement cell determining part 8 does not determine that this selection cell is a cell that should be replaced, irrespective of match or mismatch in cell identification name (step ST104).

On the other hand, if confirmed the absence of the cell in the cell origin original logical connection information table 4, which has the same data as the data about the cell type name 19 of a selection cell in the cell origin after-modification logical connection information table 6, the pin name 20 of a pin possessed by the cell, and the signal name 22 assigned to the pin, the replacement cell determining part 8 determines that this selection cell is a cell that should be replaced, and stores the cell identification name in the replacement cell information table 10 (step ST105).

Then, the replacement cell determining part 8 confirms whether all the cells stored in the cell origin after-modification logical connection information table 6 are subjected to the processing of steps ST103 to ST105. If all the cells are not subjected to these processing, any untreated cell is subjected to the processing of steps ST103 to ST105 (step ST106). On the other hand, if all the cells are subjected to these processing, the flow proceeds to step ST107 shown in FIG. 5.

As shown in step ST107 in FIG. 5, the rerouting signal determining part 9 reads the signal origin original logical connection information table 5 and the signal origin after-modification logical connection information table 7. Then, the determining part 9 reads out the data about the signal name 22 of a signal arbitrarily selected from the signal origin after-modification logical connection information table 7, the pin name 20 of a pin to which the signal is applied, the cell identification name 18 of a cell having the pin, and the cell type name 19 of the cell, and then examines whether a signal having the same data as the data about the pin name 20, the cell identification name 18, the cell type name 19 is present in the signal origin original logical connection information table 5.

Relating to the cell identification name 18, however, even if no match exists between the signal origin original logical connection information table 5 and the signal original after-modification logical connection information table 7, one that the replacement cell determining part 8 does not determine as a cell that should be replaced is handled as match.

This processing prevents rerouting even of a signal connected to a cell, which is not a cell that should be replaced.

For example, in the case where the signals of signal names sig1, sig2 and sig4 are selection signals as comparison objects, it is examined whether the data about the pin name 20 of the signal names sig1, sig2 and sig4, the cell identification name 18 of a cell having the pin, and the cell type name 19 of the cell are present in the signal origin original logical connection information table 5. In this case, the signal origin after-modification logical connection information table 7 of FIG. 11 contains the cell identification name g200, whereas FIG. 10 does not contain the cell identification name g200. However, the replacement cell determining part 8 does not determine the cell identification name g200 as a cell that should be replaced, so that the rerouting signal determining part 9 determines it as the same signal.

Accordingly, relating to the signal names sig1, sig2 and sig4 in the signal origin after-modification logical connection information table 7 of FIG. 11, the data about the pin name 20, the cell identification name 18 and the cell type name 19 match the data in the signal origin original logical connection information table 5 of FIG. 10. This indicates the presence of a signal having the same data in the signal origin original logical connection information table 5.

In other case where the signal of the signal name wire11 in the signal origin after-modification logical connection information table 7 of FIG. 11 is a selection signal as a comparison object, the signal name wire11 is not present in the signal origin original logical connection information table 5 of FIG. 10. However, relating to the signal name wire11, the data about the pin name 20, the cell identification name 18 and the cell type name 19 match the data about the signal of the signal name sig11 in the signal origin original logical connection information table 5 of FIG. 10. This indicates the presence of a signal having the same data in the signal origin original logical connection information table 5.

If confirmed that signal, which has the same data as the data about the pin name 20 of a selection signal in the signal origin after-modification logical connection information table 7, the cell identification name 18, and the cell type name 19 are present in the signal origin original logical connection information table 5, the rerouting signal determining part 9 does not determine that this selection signal is a signal that should be rerouted, irrespective of match or mismatch in signal name (step ST108).

On the other hand, if confirmed that the signal, which has the same data as the data about the pin name 20 of a selection signal in the signal origin after-modification logical connection information table 7, the cell identification name 18, and the cell type name 19 are not present in the signal origin original logical connection information table 5, the rerouting signal determining part 9 determines that this signal is a signal that should be rerouted, and stores the signal name in the rerouting signal information table 11 (step ST109).

Then, the rerouting signal determining part 9 confirms whether all the signals stored in the signal origin after-modification logical connection information table 7 are subjected to the processing of steps ST107 to ST109. If all the signals are not subjected to these processing, any untreated signal is subjected to the processing of steps ST107 to ST109 (step ST110). On the other hand, if all the signals are subjected to these processing, the flow proceeds to step ST111.

The result of the rerouting signal determination processing (steps ST107 to ST110) in the rerouting signal determination part 9 is that the signal of the signal name wire11 is the same as the signal of the signal name sig11. This information is information that should be applied to the replacement cell determining part 8 and used as determination conditions in the replacement cell determination processing, as described above. Accordingly, the routing signal determining part 9 confirms whether the replacement cell determination processing in consideration of this information is performed in the replacement cell determining part 8 (step ST111).

If the confirmation result is that the replacement cell determination processing is performed in consideration of the above-mentioned information, the flow proceeds to step ST113. On the other hand, if the replacement cell determination processing is not performed in consideration of the above-mentioned information, the flow proceeds to steps ST112 to supply the information of the rerouting signal determination processing result to the replacement cell determining part 8, and then execute again the replacement cell determination processing in steps ST103 to ST106.

The placement part 12 reads the information of the placement and routing information data base 14 and the replacement cell information table 10, and replaces only the cell having the cell identification name stored in the replacement cell information table 10, and then updates the placement and routing information of the placement and routing information data base 14 (step ST113).

The routing part 13 reads the information of the placement and routing information data base 14 and the rerouting signal information table 11, and reroutes only the signal having the signal name stored in the rerouting signal information table 11, and then updates the placement and routing information of the placement and routing information data base 14 (step ST114).

A-3. Effects

Thus, in accordance with the automatic placement and routing apparatus 100 of the first preferred embodiment of the present invention, in addition to the case of finding a full match of a data group in which cells before and after modification to logical connection information are used as the origin, namely, a full match of the cell identification name 18, the cell type name 19, the pin name 20 of the cell, and the signal name 22 assigned to the pin, the case where only the cell identification name 18 is different and other data are matched is not handled as a cell that should be replaced.

Further, in addition to the case of finding a full match of a data group in which signals before and after modification to logical connection information are used as the origin, namely, a full match in the signal name 22, the pin name 20 to which the signal is applied, the cell identification name 18 of a cell possessed by the pin, and the cell type name 19 of the cell, the case where only the signal name 22 is different and other data are matched is not handled as a signal that should be rerouted. Therefore, even if after the placement and routing based on the original logical connection information, the logical connection information is modified and such modification requires cell replacement and rerouting between cells, at least sufficient replacement and rerouting is executable thereby to reduce unnecessary replacement and rerouting, thus permitting efficient placement and routing.

Additionally, elimination of unnecessary replacement and rerouting avoids that the timing error associated with replacement and rerouting occurs at portions whose logical connection information is not modified.

B. Second Preferred Embodiment

B-1. Apparatus Configuration

Figure 12:
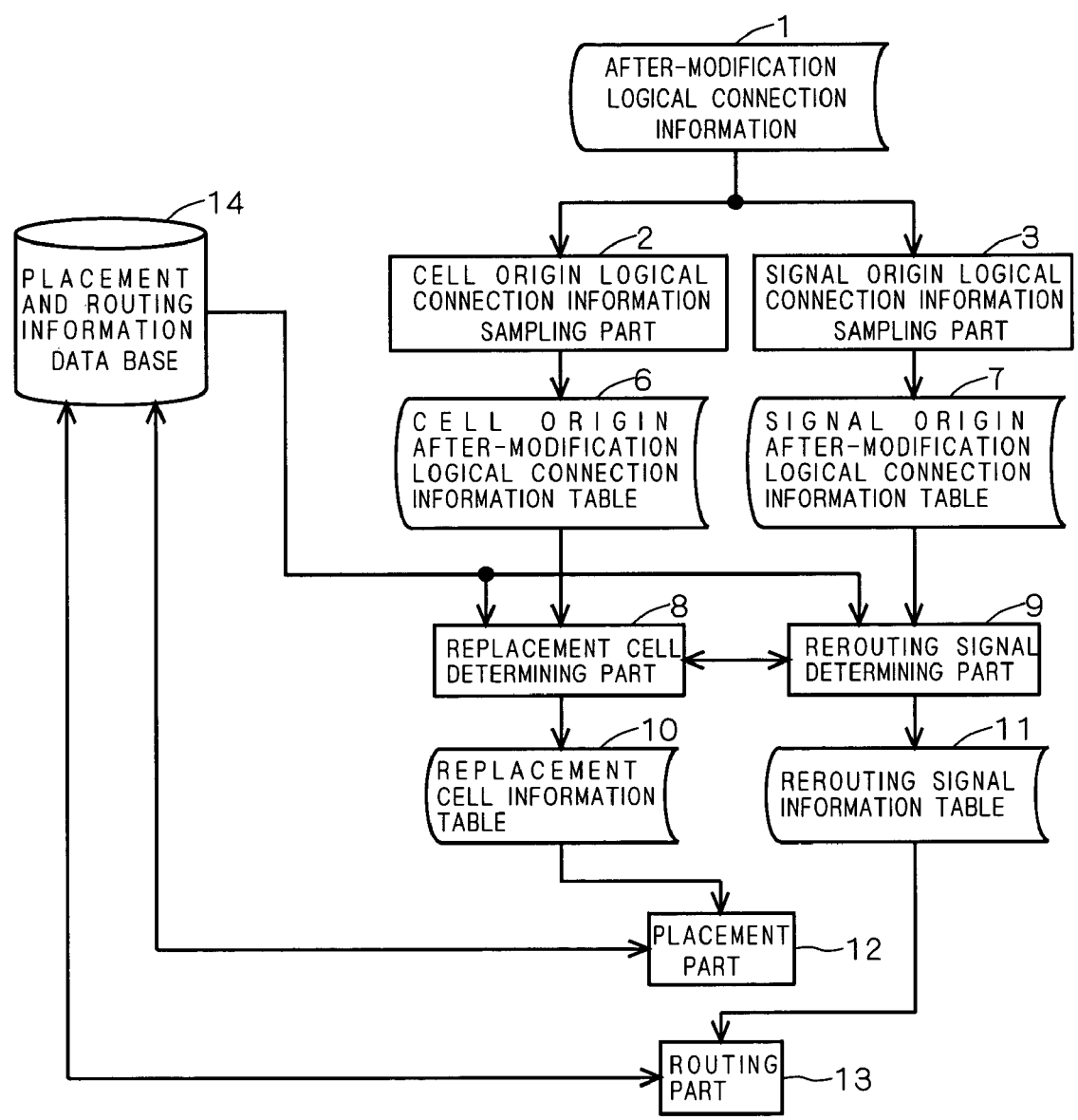
FIG. 12 is a block diagram showing the configuration of an automatic placement and routing apparatus of a second preferred embodiment according to the present invention.

FIG. 12 is a block diagram showing the configuration of an automatic placement and routing apparatus 200 of a second preferred embodiment in accordance with the present invention. Similar reference numerals have been used to denote the same components as the automatic placement and routing apparatus 100 shown in FIG. 1, and the overlapping descriptions are omitted here.

Referring to FIG. 12, like the automatic placement and routing apparatus 100 shown in FIG. 1, the automatic placement and routing apparatus 200 is an apparatus to perform automatic placement and routing based on the information of a placement and routing information data base 14 storing after-modification logical connection information 1 and the information about placement and routing (including the original logical connection information prior to modification). Unlike the automatic placement and routing apparatus 100, a cell origin logical connection information sampling part 2 reads only the after-modification logical connection information and outputs only a cell origin after-modification logical connection information table 6. A signal origin logical connection information sampling part 3 reads only the after-modification logical connection information 1 and outputs only a signal origin after-modification logical connection information table 7.

Then, a replacement cell determining part 8 reads the cell origin after-modification logical connection information table 6, and then compares a plurality of data while reading the placement and routing information data base 14, thereby outputting a replacement cell information table 10. A rerouting signal determining part 9 reads the signal origin after-modification logical connection information table 7, and then compares a plurality of data while reading the placement and routing information data base 14, thereby outputting a rerouting signal information table 11.

B-2. Apparatus Operation

Figure 13:
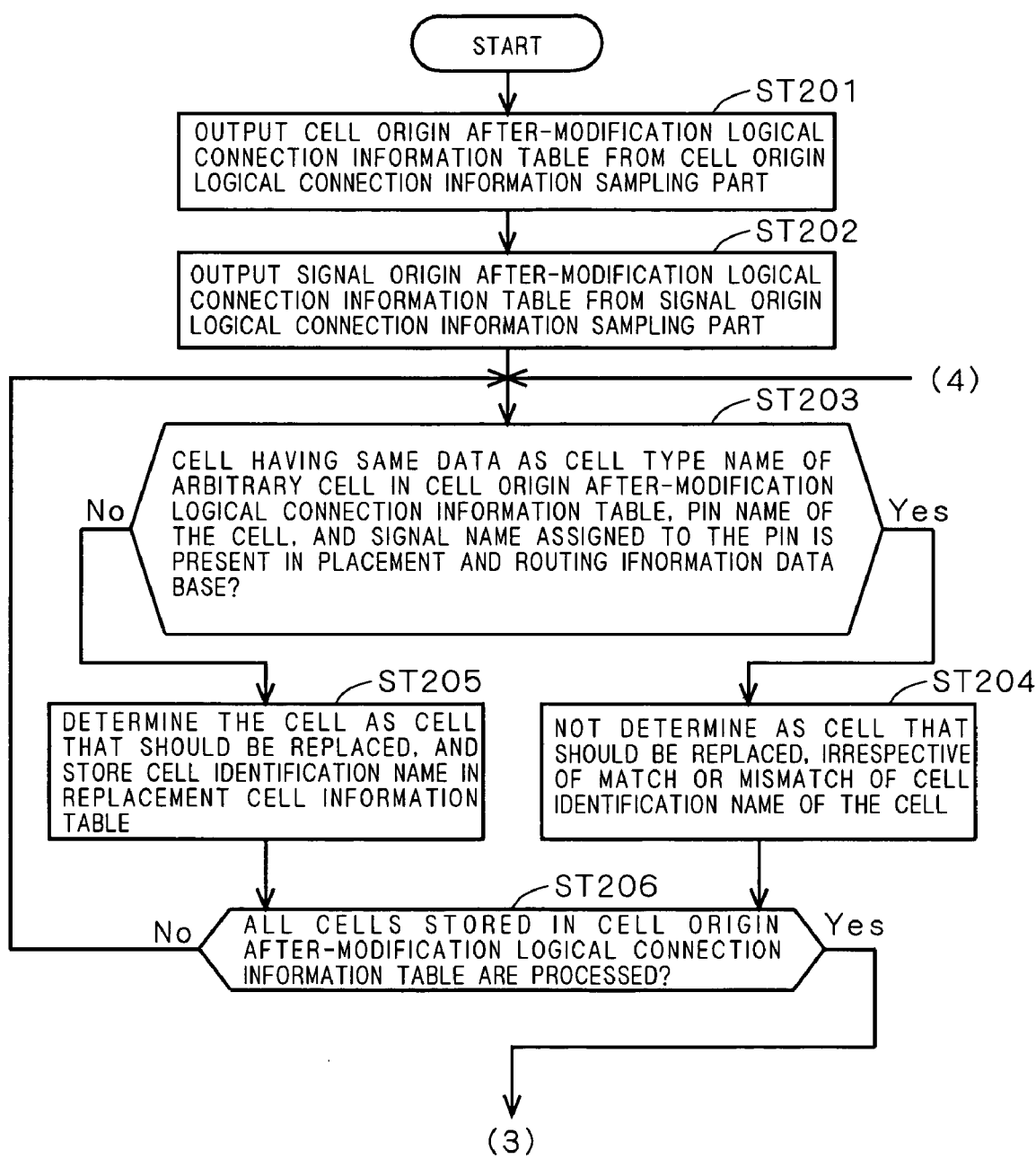
FIGS. 13 and 14 are flowcharts showing the operation of the automatic placement and routing apparatus of the second preferred embodiment.
Figure 14:
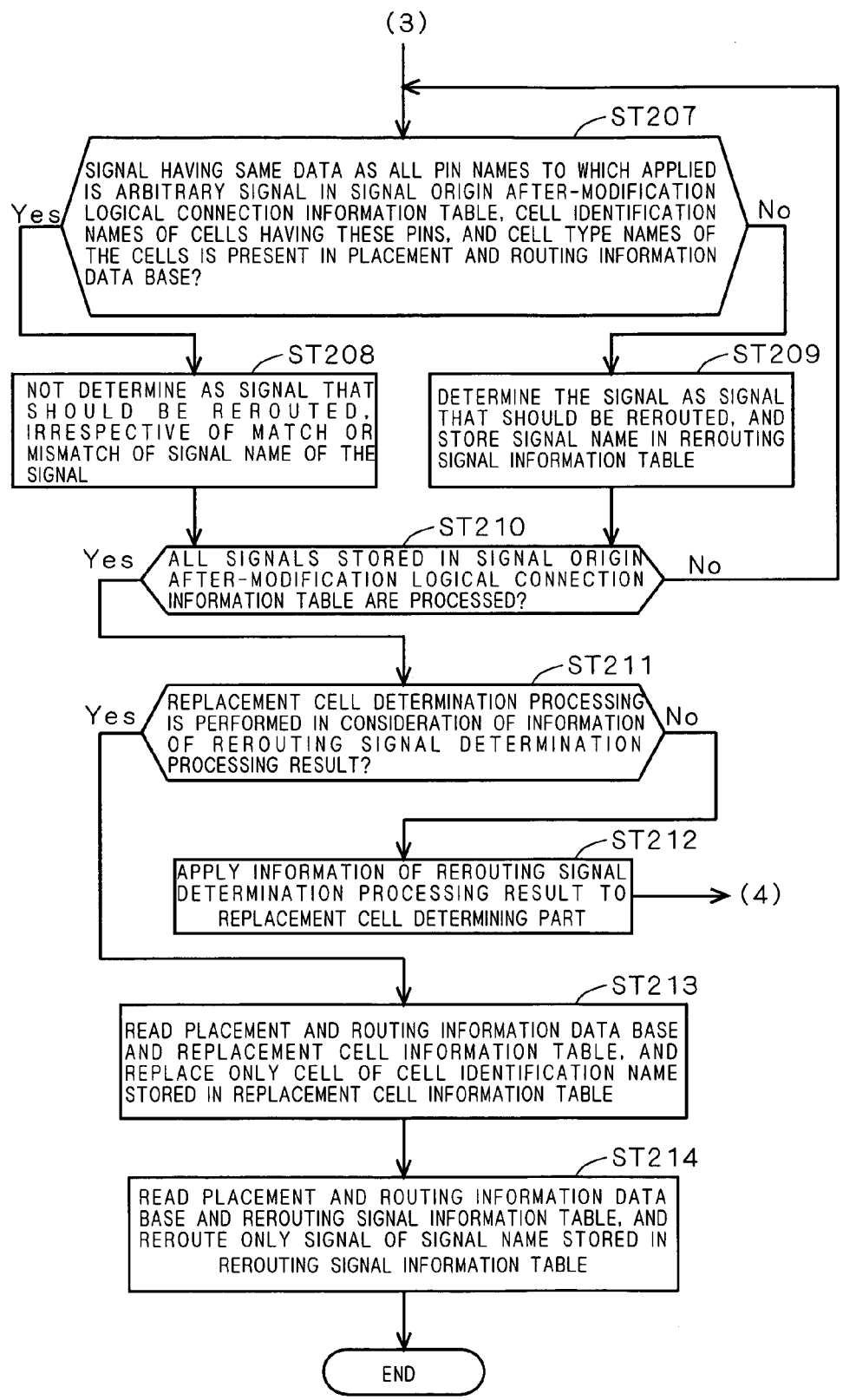

The replacement and rerouting operations of the automatic placement and routing apparatus 200 are now described by using the flowcharts shown in FIGS. 13 and 14. In FIGS. 13 and 14, a sequence of flow is divided for purposes of illustration, and the two are jointed to each other by the symbols (3) and (4). In the following, as example of before-modification original logical connection information, one that is shown in FIG. 2 is used. As example of after-modification logical connection information, one that is shown in FIG. 3 is used. As a cell origin after-modification logical connection information table 6 and a signal origin after-modification logical connection information table 7, one that is shown in FIG. 8, and one that is shown in FIG. 11 are used respectively.

When replacement and rerouting operations are started, first, in step ST201 shown in FIG. 13, the cell origin logical connection information sampling part 2 reads the after-modification logical connection information 1, and outputs the cell origin after-modification logical connection information table 6.

The signal origin logical connection information sampling part 3 reads the after-modification logical connection information 1, and outputs the signal origin after-modification logical connection information table 7 shown in FIG. 11 (step ST202).

Next, as shown in step ST203, the replacement cell determining part 8 reads the cell origin after-modification logical connection information table 6, and then reads the information of the placement and routing information data base 14. Thereafter, the determining part 8 reads out the data about the cell identification name 18 of a cell arbitrarily selected from the cell origin after-modification logical connection information table 6, the cell type name 19, the pin name 20 of a pin possessed by the cell, and the signal name 22 assigned to the pin. Then, the determining part 8 examines whether a cell having the same data as the data about the cell type name 19, the pin name 20 and the signal name 22 is present in the placement and routing information data base 14.

Since the placement and routing information data base 14 contains all information contained in the cell origin original logical connection information table 4 of FIG. 7, a comparison between the placement and routing information data base 14 and the cell origin after-modification logical connection information table 6 is substantially the same as a comparison between the cell origin original logical connection information table 4 and the cell origin after-modification logical connection information table 6.

Relating to the signal name 22, although there are mismatches between the cell origin original logical connection information table 4 and the cell origin after-modification logical connection information table 6, as described later, the signal name 22, which the rerouting signal determining part 9 does not determine as a signal that should be rerouted, is handled as match in the replacement cell determining part 8.

If confirmed that the cell, which has the same data as the data about the cell type name 19 of a selection cell in the cell origin after-modification logical connection information table 6, the pin name 20 of a pin possessed by the cell, and the signal name 22 assigned to the pin, is present in the placement and routing information data base 14, the replacement cell determining part 8 does not determine that this selection cell is a cell that should be replaced, irrespective of match or mismatch in cell identification name (step ST204).

On the other hand, if confirmed that the cell, which has the same data as the data about the cell type name 19 of a selection cell in the cell origin after-modification logical connection information table 6, the pin name 20 of a pin possessed by the cell, and the signal name 22 assigned to the pin, is not present in the placement and routing information data base 14, the replacement cell determining part 8 determines that this selection cell is a cell that should be replaced, and stores the cell identification name in the replacement cell information table 10 (step ST205).

Then, the replacement cell determining part 8 confirms whether all the cells stored in the cell origin after-modification logical connection information table 6 are subjected to the processing of steps ST203 to ST205. If all the cells are not subjected to these processing, any untreated cell is subjected to the processing of steps ST203 to ST205 (step ST206). On the other hand, if all the cells are subjected to these processing, the flow proceeds to step ST207 shown in FIG. 14.

As shown in step ST207 in FIG. 14, the rerouting signal determining part 9 reads the signal origin after-modification logical connection information table 7, and thereafter reads the placement and routing information data base 14. Then, the determining part 9 reads out the data about the signal name 22 of a cell arbitrarily selected from the signal origin after-modification logical connection information table 7, the pin name 20 of a pin to which the signal is applied, the cell identification name 18 of a cell having the pin, and the cell type name 19 of the cell, and then examines whether a signal having the same data as the pin name 20, the cell identification name 18 and the cell type name 19 are present in the placement and routing information data base 14.

Since the placement and routing information data base 14 contains all the information contained in the signal origin original logical connection information table 5 of FIG. 10, a comparison between the placement and routing information data base 14 and the signal origin after-modification logical connection information table 7 is substantially the same as a comparison between the signal origin original logical connection information table 5 and the signal origin after-modification logical connection information table 7.

Relating to the cell identification name 18, however, even if no match exists between the signal origin after-modification logical connection information table 7 and the placement and routing information data base 14, one that the rerouting signal determining part 9 does not determine as a signal that should be rerouted is handled as match.

If confirmed that the signal, which has the same data as the data about the pin name 20 of a selection signal in the signal origin after-modification logical connection information table 7, the cell identification name 18 and the cell type name 19 are present in the placement and routing information data base 14, the rerouting signal determining part 9 does not determine that this selection signal is a signal that should be rerouted, irrespective of match or mismatch in signal name (step ST208).

On the other hand, if confirmed that the signal, which has the same data as the data about the pin name 20 of a selection signal in the signal origin after-modification logical connection information table 7, the cell identification name 18, and the cell type name 19 are not present in the placement and routing information data base 14, the rerouting signal determining part 9 determines that this signal is a signal that should be rerouted, and stores the signal name in the rerouting signal information table 11 (step ST209).

Then, the rerouting signal determining part 9 confirms whether all the signals stored in the signal origin after-modification logical connection information table 7 are subjected to the processing of steps ST207 to ST209. If all the signals are not subjected to these processing, any untreated signal is subjected to the processing of steps ST207 to ST209 (step ST210). On the other hand, if all the signals are subjected to these processing, the flow proceeds to step ST211.

The result of the rerouting signal determination processing (steps ST207 to ST210) in the rerouting signal determination part 9 is that the signal of the signal name wire11 is the same as the signal of the signal name sig11. This information is information that should be applied to the replacement cell determining part 8 and used as determination conditions in the replacement cell determination processing, as described above. Accordingly, the rerouting signal determining part 9 confirms whether the replacement cell determination processing in consideration of this information is performed in the replacement cell determining part 8 (step ST211).

If the confirmation result is that the replacement cell determination processing is performed in consideration of the above-mentioned information, the flow proceeds to step ST213. On the other hand, if the replacement cell determination processing is not performed in consideration of the above-mentioned information, the flow proceeds to steps ST212 to supply the information of the rerouting signal determination processing result to the replacement cell determining part 8, and then execute again the replacement cell determination processing in steps ST203 to ST206.

The placement part 12 reads the information of the placement and routing information data base 14 and the replacement cell information table 10, and replaces only the cell having the cell identification name stored in the replacement cell information table 10, and then updates the placement and routing information of the placement and routing information data base 14 (step ST213).

The routing part 13 reads the information of the placement and routing information data base 14 and the rerouting signal information table 11, and reroutes only the signal having the signal name stored in the rerouting signal information table 11, and then updates the placement and routing information of the placement and routing information data base 14 (step ST214).

B-3. Effects

Thus, in accordance with the automatic placement and routing apparatus 200 of the second preferred embodiment of the present invention, like the automatic placement and routing apparatus 100 of the first preferred embodiment, even if after the placement and routing based on the original logical connection information, the logical connection information is modified and such modification requires cell replacement and rerouting between cells, at least sufficient replacement and rerouting is executable thereby to reduce unnecessary replacement and rerouting, thus permitting efficient placement and routing.

Additionally, elimination of unnecessary replacement and rerouting avoids that the timing error associated with replacement and rerouting occurs at portions whose logical connection information is not modified.

Additionally, instead of creating the cell origin original logical connection information table 4 and the signal origin original logical connection information table 5, it is configured so as to obtain the information contained in these tables from the placement and routing information data base 14.

This enables to reduce the amount of use of memory than the case of creating the cell origin original logical connection information table 4 and the signal origin original logical connection information table 5.

C. Third Preferred Embodiment

C-1. Apparatus Configuration

Figure 15:
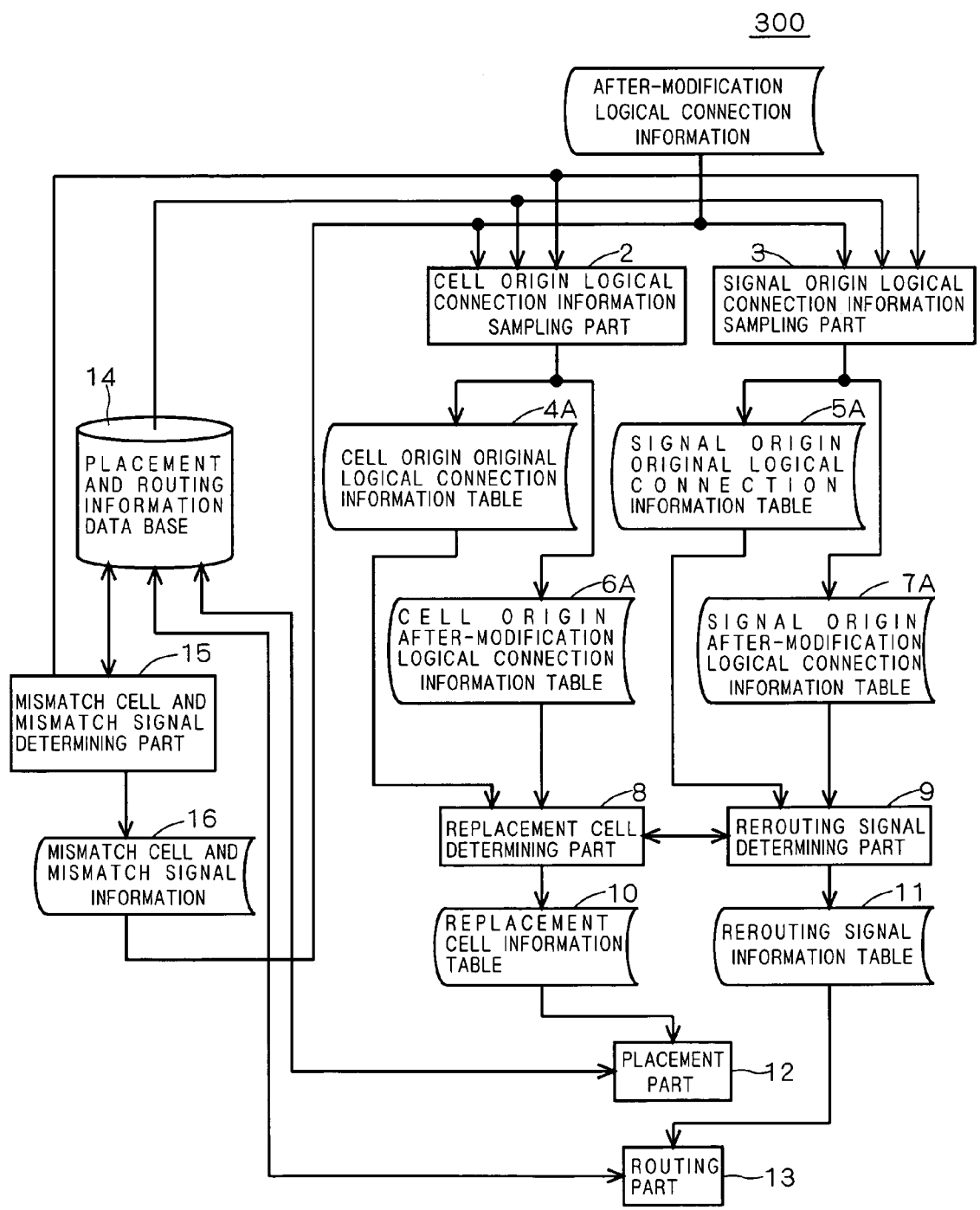
FIG. 15 is a block diagram showing the configuration of an automatic placement and routing apparatus of a third preferred embodiment according to the present invention.

FIG. 15 is a block diagram showing the configuration of an automatic placement and routing apparatus 300 in a third preferred embodiment in accordance with the present invention. Similar reference numerals have been used to denote the same components as the automatic placement and routing apparatus 100 shown in FIG. 1, and the overlapping descriptions are omitted here.

Referring to FIG. 13, in addition to the configuration of the automatic placement and routing apparatus 100 that performs automatic placement and routing based on the information of the placement and routing information data base 14 storing the after-modification logical connection information 1 and the information about placement and routing (including the original logical connection information prior to modification), the automatic placement and routing apparatus 300 further comprises a mismatch cell and mismatch signal determining part 15. Based on the after-modification logical connection information 1 and the information of the placement and routing information data base 14, the mismatch cell and mismatch signal determining part 15 determines a cell that should be replaced and a signal that should be rerouted, and then outputs mismatch cell and mismatch signal information 16. It is configured such that the information 16 is applied to a cell origin logical connection information sampling part 2 and a signal origin logical connection information sampling part 3.

A further description is given of the basic operation of the mismatch cell and mismatch signal determining part 15. In the following, as example of before-modification original logical connection information, one that is shown in FIG. 2 is used. As example of after-modification logical connection information, one that is shown in FIG. 3 is used.

The mismatch cell and mismatch signal determining part 15 reads the original logical connection information stored in the placement and routing information data base 14 and the after-modification logical connection information 1. Then, the determining part 15 compares and determines the data of cells having different cell identification names as a mismatch cell, and the data of signals having different signal names as a mismatch signal, and then outputs as mismatch cell and mismatch signal information 16 (comparison result information).

Figure 16:
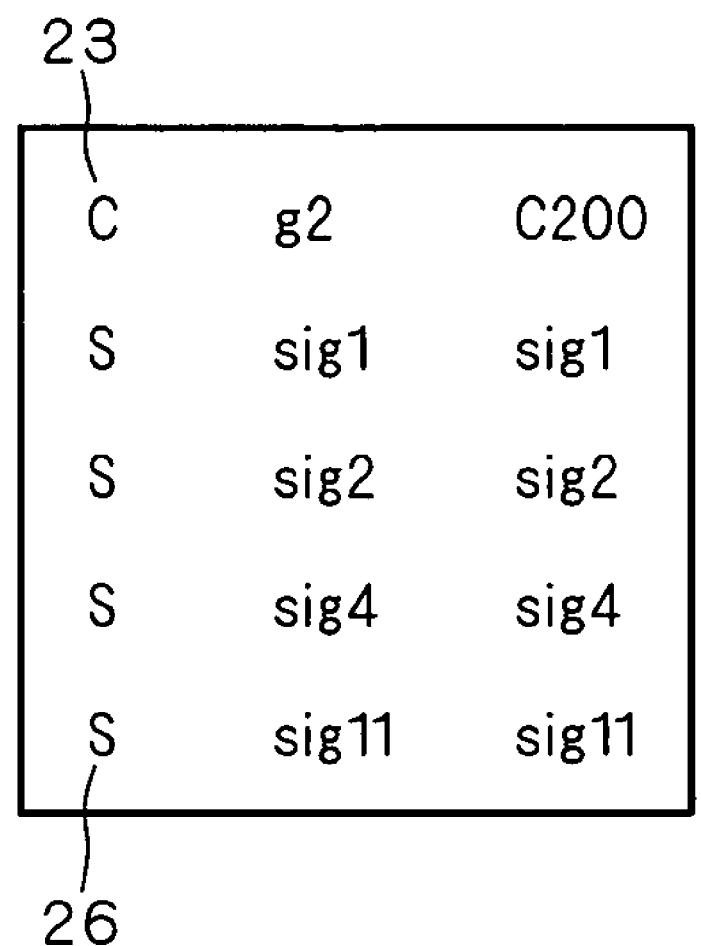
FIG. 16 is a diagram showing one example of mismatch cell and mismatch signal information.

FIG. 16 shows one example of the mismatch cell and mismatch information 16. This information is obtained on the basis of the before-modification original logical connection information shown in FIG. 2, and the after-modification logical connection information shown in FIG. 3.

For example, a comparison of the original logical connection information of FIG. 2 with the after-modification logical connection information of FIG. 3 indicates that the cell of cell identification name g2 in FIG. 2 mismatches the cell of cell identification name g200 in FIG. 3, and the signal of signal name sig11 in FIG. 2 also mismatches the signal of signal name wire11 in FIG. 3.

Although between FIGS. 2 and 3, the signals of signals names sig1, sig2 and sig4 are matched in signal name, they are signals applied to the mismatch cells g200 and g2, and therefore, they are handled as a mismatch signal.

This comparison result information is tabled to obtain the mismatch cell and mismatch signal information 16 shown in FIG. 16. In FIG. 16, a mismatch cell and a mismatch signal are described in keywords 23 and 26, respectively. In FIG. 16, alphabet "C" is used as the keyword 23 indicating a mismatch cell, and alphabet "S" is used as the keyword 26 indicating a mismatch signal.

The mismatch cell information in the original logical connection information and the after-modification logical connection information are indicated by the cell identification names, which are arrayed with their respective correspondence. Likewise, the mismatch signal information in the original logical connection information and the after-modification logical connection information are indicated by the signal names, which are arrayed with their respective correspondence.

C-2. Apparatus Operation

Figure 17:
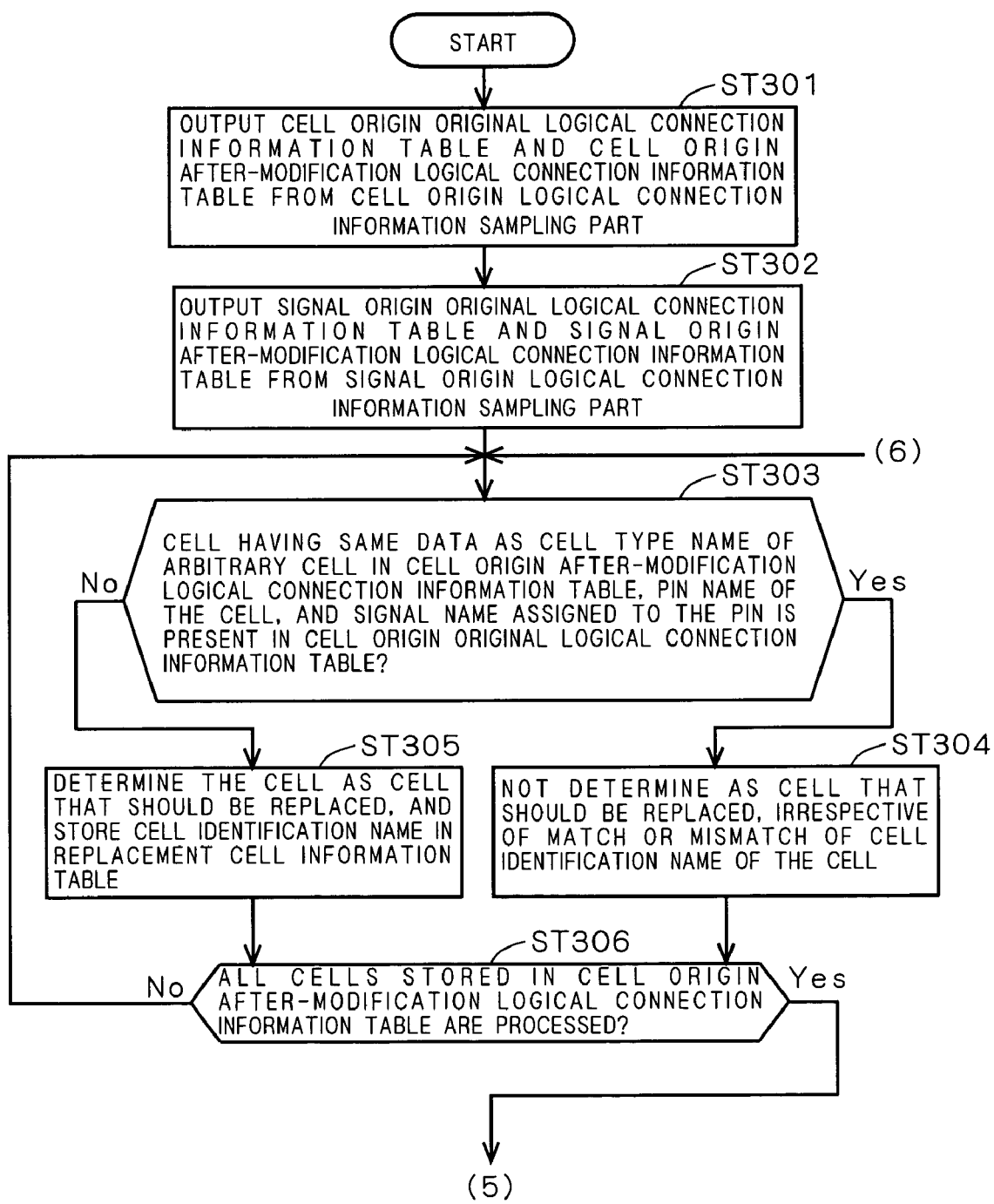
FIGS. 17 and 18 are flowcharts showing the operation of the automatic placement and routing apparatus of the third preferred embodiment.
Figure 18:
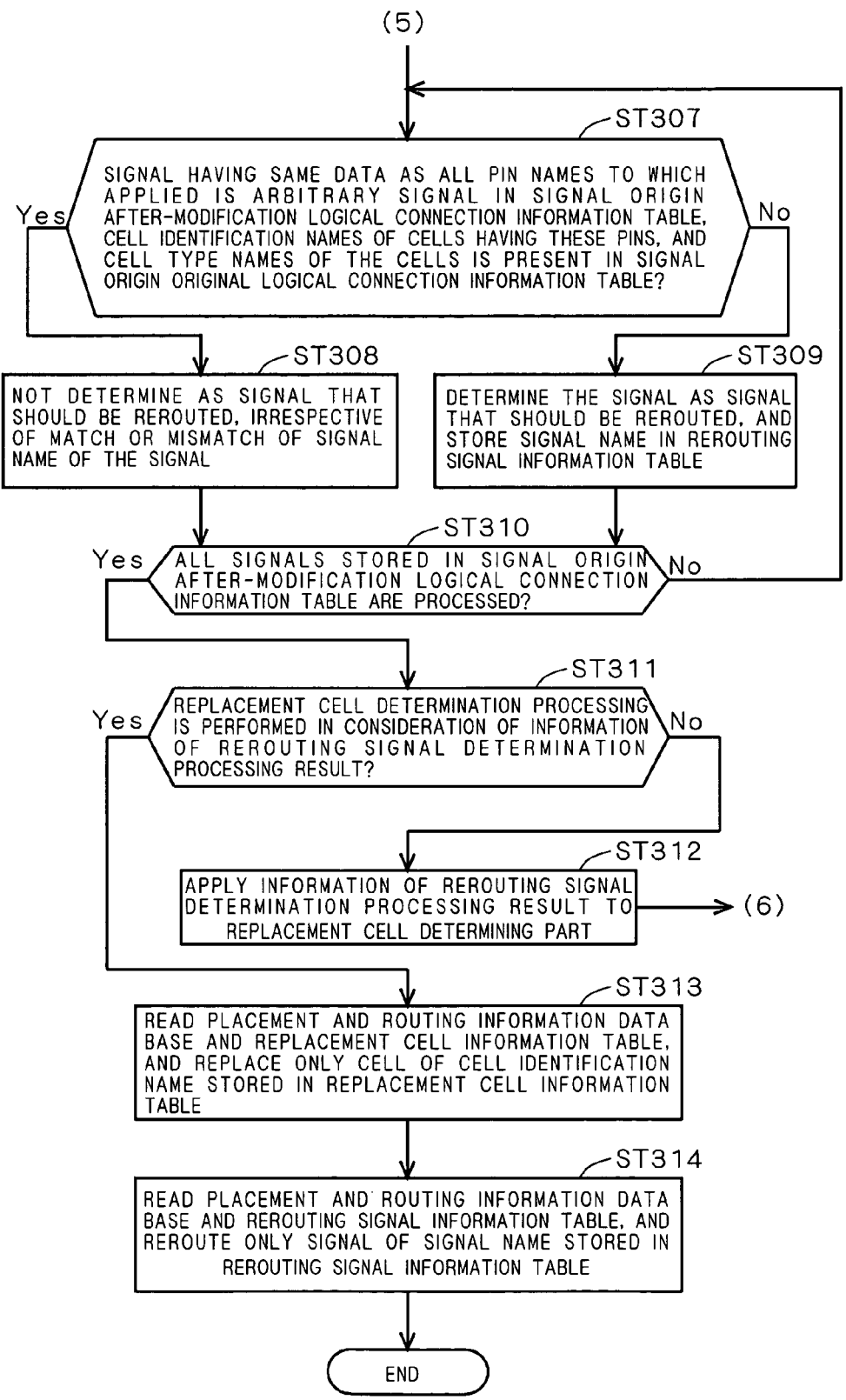

The replacement and rerouting operations of the automatic placement and routing apparatus 300 are now described by using the flowcharts shown in FIGS. 17 and 18. In FIGS. 17 and 18, a sequence of flow is divided for purposes of illustration, and the two are jointed to each other by the symbols (5) and (6).

When replacement and rerouting operations are started, first, in step ST301 shown in FIG. 17, the cell origin logical connection information sampling part 2 reads the original logical connection information stored in the placement and routing information data base 14, and the mismatch cell and mismatch signal information 16, and then outputs a cell origin original logical connection information table 4A only to the cell identification name contained in the mismatch cell and mismatch signal information 16. Further, the sampling part 2 reads the after-modification logical connection information 1, and outputs a cell origin after-modification logical connection information table 6A only to the cell identification name contained in the mismatch cell and mismatch signal information 16.

Here, the cell original connection information table 4A and the cell origin after-modification logical connection information table 6A are created on the basis of the cell origin logical connection information format shown in FIG. 6.

Based on such a cell origin logical connection information format, the original logical connection information of FIG. 2 is tabled to obtain the cell origin original logical connection information table 4A of FIG. 19, and the after-modification logical connection information of FIG. 3 is tabled to obtain the cell origin after-modification logical connection information table 6A of FIG. 20.

The reason why FIG. 19 shows only the data about the cell of cell identification name g2 is that only the cell of cell identification name g2 is related to the original logical connection information in the cell identification names contained in the mismatch cell and mismatch signal information 16 shown in FIG. 16.

Although FIG. 20 is basically similar to FIG. 19, FIG. 20 shows only the data about the cell of cell identification name g200. This is because only the cell of cell identification name g200 is related to the after-modification logical connection information 1 in the cell identification names contained in the mismatch cell and mismatch signal information 16 shown in FIG. 16.

In the foregoing description, the cell origin logical connection information format shown in FIG. 6 is used to create the cell origin original logical connection information table 4A and the cell origin after-modification logical connection information table 6A. This is cited merely by way of example and without limitation, but other format may be used.

Returning to FIG. 17, the description is now continued.

In step ST302, the signal origin logical connection information sampling part 3 reads the original logical connection information stored in the placement and routing information data base 14, and the mismatch cell and mismatch signal information 16, and outputs the signal origin original logical connection information table 5A only to the signal names contained in the mismatch cell and mismatch signal information 16. The sampling part 3 also reads the after-modification logical connection information 1, and outputs the signal origin after-modification logical connection information table A7 only to the signal name contained in the mismatch cell and mismatch signal information 16.

Here, the signal origin original logical connection information table 5A and the signal origin after-modification logical connection information table 7A are created on the basis of the signal origin logical connection information format shown in FIG. 9.

Based on such a signal origin logical connection information format, the original logical connection information of FIG. 2 is tabled to obtain the signal origin original logical connection information table 5A of FIG. 21, and the after-modification logical connection information of FIG. 3 is tabled to obtain the signal origin after-modification logical connection information table 7A of FIG. 22.

The reason why FIG. 21 shows only the data about the signals of signal names sig1, sig2, sig4 and sig11 is that only the signals of signal names sig1, sig2, sig4 and sig11 are related to the original logical connection information in the signal names contained in the mismatch cell and mismatch signal information 16 shown in FIG. 16.

Although FIG. 22 is basically similar to FIG. 21, FIG. 22 shows only the data about the data about the signals of signal names sig1, sig2, sig4 and wire11. This is because only the data about the signals of signal names sig1, sig2, sig4 and wire11 are related to the after-modification logical connection information 1 in the signal names contained in the mismatch cell and mismatch signal information 16 shown in FIG. 16.

In the foregoing description, the signal origin logical connection information format of FIG. 9 is used to create the signal origin original logical connection information table 5A and the cell origin after-modification logical connection information table 7A. This is cited merely by way of example and without limitation, but other format may be used.

Returning to FIG. 17, the description is now continued.

Next, as shown in step ST303, the replacement cell determining part 8 reads the cell origin logical connection information table 4A and the cell origin after-modification logical connection information table 6A. Then, the determining part 8 reads out the data about the cell identification name 18 of a cell arbitrarily selected from the cell origin after-modification logical connection information table 6A, the cell type name 19, the pin name 20 of a pin possessed by the cell, and the signal name 22 assigned to the pin, and then examines whether a cell having the same data as the cell type name 19, the pin name 20 and the signal name 22 is present in the cell origin original logical connection information table 4A.

Relating to the signal name 22, although there are mismatches between the cell origin original logical connection information table 4A and the cell origin after-modification logical connection information table 6A, as described later, the signal name 22, which the rerouting signal determining part 9 does not determine as a signal that should be rerouted, is handled as match in the replacement cell determining part 8.

In the case where the cell of cell identification name g200 in the cell origin after-modification logical connection information table 6A of FIG. 20 is a selection cell as a comparison object, the cell identification name g200 is not present in the cell origin original logical connection information table 4A of FIG. 19. However, as to the cell identification name g200, the data about the cell type name 19, the pin name 20 of a pin possessed by the cell, and the signal name 22 assigned to the pin, match the data about the cell of cell identification name g2 in the cell origin original logical connection information table 4A of FIG. 19. This indicates the presence of a cell having the same data in the cell origin original logical connection information table 4A.

If confirmed that the cell, which has the same data as the data about the cell type name 19 of a selection cell in the cell origin after-modification logical connection information table 6A, the pin name 20 of a pin possessed by the cell, and the signal name 22 assigned to the pin, is present in the cell origin original logical connection information table 4A, the replacement cell determining part 8 does not determine that this selection cell is a cell that should be replaced, irrespective of match or mismatch in cell identification name (step ST304).

On the other hand, if confirmed that the cell, which has the same data as the data about the cell type name 19 of a selection cell in the cell origin after-modification logical connection information table 6A, the pin name 20 of a pin possessed by the cell, and the signal name 22 assigned to the pin, is not present in the cell origin original logical connection information table 4A, the replacement cell determining part 8 determines that this selection cell is a cell that should be replaced, and stores the cell identification name in the replacement cell information table 10 (step ST305).

Then, the replacement cell determining part 8 confirms whether all the cells stored in the cell origin after-modification logical connection information table 6A are subjected to the processing of steps ST303 to ST305. If all the cells are not subjected to these processing, any untreated cell is subjected to the processing of steps ST303 to ST305 (step ST306). On the other hand, if all the cells are subjected to these processing, the flow proceeds to step ST307 shown in FIG. 18.

As shown in step ST307 in FIG. 18, the rerouting signal determining part 9 reads the signal origin original logical connection information table 5A and the signal origin after-modification logical connection information table 7A. Then, the determining part 9 reads out the data about the signal name 22 of a cell arbitrarily selected from the signal origin after-modification logical connection information table 7A, the pin name 20 of a pin to which the signal is applied, the cell identification name 18 of a cell having the pin, and the cell type name 19 of the cell, and then examines whether a signal having the same data as the data about the pin name 20, the cell identification name 18, the cell type name 19 is present in the signal origin original logical connection information table 5A.

Relating to the cell identification name 18, however, even if no match exists between the signal origin after-modification logical connection information table 5A and the signal origin after-modification logical connection information table 7A, one that the replacement cell determining part 8 does not determine as a cell that should be replaced is handled as match.

For example, in the case where the signals of signal names sig1, sig2 and sig4 are selection signals as comparison objects, it is examined whether the data about the pin name 20 of the signal names sig1, sig2 and sig4, the cell identification name 18 of a cell having the pin, and the cell type name 19 of the cell are present in the signal origin original logical connection information table 5A of FIG. 21. In this case, the signal origin after-modification logical connection information table 7A of FIG. 22 contains the cell identification name g200, whereas FIG. 21 does not contain the cell identification name g200. However, the replacement cell determining part 8 does not determine the cell of the cell identification name g200 as a cell that should be replaced, so that the rerouting signal determining part 9 determines as the same signal.

Accordingly, as to the signal names sig1, sig2 and sig4 in the signal origin after-modification logical connection information table 7A of FIG. 22, the data about the pin name 20, the cell identification name 18 and the cell type name 19 match the data in the signal origin original logical connection information table 5A of FIG. 21. This indicates the presence of a signal having the same data in the signal origin original logical connection information table 5A.

In other case where the signal of the signal name wire11 in the signal origin after-modification logical connection information table 7A of FIG. 22 is a selection signal as a comparison object, the signal name wire11 is not present in the signal origin original logical connection information table 5A of FIG. 21. However, relating to the signal name wire11, the data about the pin name 20, the cell identification name 18 and the cell type name 19 match the data about the signal of the signal name sig11 in the signal origin original logical connection information table 5A of FIG. 21. This indicates the presence of a signal having the same data in the signal origin original logical connection information table 5A.

If confirmed that the signal, which has the same data as the data about the pin name 20 of a selection signal in the signal origin after-modification logical connection information table 7A, the cell identification name 18, and the cell type name 19, is present in the signal origin original logical connection information table 5A, the rerouting signal determining part 9 does not determine that this selection signal is a signal that should be rerouted, irrespective of match or mismatch in signal name (step ST308).

On the other hand, if confirmed that the signal, which has the same data as the data about the pin name 20 of a selection signal in the signal origin after-modification logical connection information table 7A, the cell identification name 18, and the cell type name 19, is not present in the signal origin original logical connection information table 5A, the rerouting signal determining part 9 determines that this signal is a signal that should be rerouted, and stores the signal name in the rerouting signal information table 11 (step ST309).

Then, the rerouting signal determining part 9 confirms whether all the signals stored in the signal origin after-modification logical connection information table 7A are subjected to the processing of steps ST307 to ST309. If all the signals are not subjected to these processing, any untreated signal is subjected to the processing of steps ST307 to ST309 (step ST310). On the other hand, if all the signals are subjected to these processing, the flow proceeds to step ST311.

The result of the rerouting signal determination processing (steps ST307 to ST310) in the rerouting signal determination part 9 is that the signal of the signal name wire11 is the same as the signal of the signal name sig11. This information is information that should be applied to the replacement cell determining part 8 and used as determination conditions in the replacement cell determination processing, as described above. Accordingly, the routing signal determining part 9 confirms whether the replacement cell determination processing in consideration of this information is performed in the replacement cell determining part 8 (step ST311).

If the confirmation result is that the replacement cell determination processing is performed in consideration of the above-mentioned information, the flow proceeds to step S313. On the other hand, if the replacement cell determination processing is not performed in consideration of the above-mentioned information, the flow proceeds to steps ST312 to supply the information of the rerouting signal determination processing result to the replacement cell determining part 8, and then execute again the replacement cell determination processing in steps ST303 to ST306.

The placement part 12 reads the information of the placement and routing information data base 14 and the replacement cell information table 10, and replaces only the cell having the cell identification name stored in the replacement cell information table 10, and then updates the placement and routing information of the placement and routing information data base 14 (step ST313).

The routing part 13 reads the information of the placement and routing information data base 14 and the rerouting signal information table 11, and reroutes only the signal having the signal name stored in the rerouting signal information table 11, and then updates the placement and routing information of the placement and routing information data base 14 (step ST314).

C-3. Effects

Thus, in accordance with the automatic placement and routing apparatus 300 of the third preferred embodiment of the present invention, like the automatic placement and routing apparatus 100 of the first preferred embodiment, even if after the placement and routing based on the original logical connection information, the logical connection information is modified and such modification requires cell replacement and rerouting between cells, at least sufficient replacement and rerouting is executable thereby to reduce unnecessary replacement and rerouting, thus permitting efficient placement and routing.

Additionally, elimination of unnecessary replacement and rerouting avoids that the timing error associated with replacement and rerouting occurs at portions whose logical connection information is not modified.

Additionally, the automatic placement and routing apparatus 300 includes the mismatch cell and mismatch signal determining part 15, and uses the cell origin original logical connection information table 4A and the cell origin after-modification logical connection information table 6A, which contain only the information about cell identification names in the comparison result information (the mismatch cell and mismatch signal information 16) between the original logical connection information and the after-modification logical connection information, and also uses the signal origin original connection information table 5A and the signal origin after-modification logical connection information table 7A, which contain only the information about signal names in the comparison result information (the mismatch cell and mismatch signal information 16). This permits to reduce the processing time to determine a cell that should be replaced, and a signal that should be rerouted.

While the invention has been shown and described in detail, the foregoing description is in all aspects illustrative and not restrictive. It is therefore understood that numerous modifications and variations can be devised without departing from the scope of the invention.

What is claimed is:

1. An automatic placement and routing apparatus to automatically perform placement and routing of a cell, based on original logical connection information, comprising:

a cell origin logical connection information sampling part that receives after-modification logical connection information applied when said original logical connection information is modified, and outputs cell origin logical connection information with said cell as an origin;

a signal origin logical connection information sampling part that receives said after-modification logical connection information and outputs signal origin logical connection information with a signal applied to said routing as an origin;

a replacement cell determining part that receives said cell origin logical connection information and determines a replacement cell that should be replaced; and a rerouting signal determining part that receives said signal origin logical connection information and determines a rerouting signal that should be rerouted, wherein said replacement cell determining part makes a comparison, in cell units, between said after-modification logical connection information and said original logical connection information, and does not determine a comparison object cell as said replacement cell, if the sole difference is cell identification name, and said rerouting signal determining part makes a comparison, in signal units, between said after-modification logical connection information and said original logical connection information, and does not determine a comparison object signal as said rerouting signal, if the sole difference is signal name.

2. The automatic placement and routing apparatus according to claim 1 wherein said cell origin logical connection information is collected per specific cell, and contains information about said cell identification name of said specific cell, cell type name of said specific cell, pin names of all pins possessed by said specific cell, and signal names of signals assigned to said all pins, respectively, and said signal origin logical connection information is collected per specific signal, and contains information about said signal names of said specific signal, pin names of all pins to which said specific signal is applied, cell identification names and cell type names of all cells having said all pins.

3. The automatic placement and routing apparatus according to claim 1 wherein said cell origin logical connection information sampling part also receives said original logical connection information and outputs, as said cell origin logical connection information, cell origin original logical connection information based on said original logical connection information, and cell origin after-modification logical connection information based on said after-modification logical connection information, said replacement cell determining part receives said cell origin after-modification logical connection information as said after-modification logical connection information, and receives said cell origin original logical connection information as said logical connection information, said signal origin logical connection information sampling part also receives said logical connection information and outputs, as said signal origin logical connection information, signal origin original logical connection information based on said logical connection information, and signal origin after-modification logical connection information based on said after-modification logical connection information, and said rerouting signal determining part receives said signal origin after-modification logical connection information as said after-modification logical connection information, and receives said signal origin original logical connection information as said logical connection information.

4. The automatic placement and routing apparatus according to claim 1 wherein said cell origin logical connection information sampling part outputs, as said cell origin logical connection information, cell origin after-modification logical connection information based on said after-modification logical connection information, said replacement cell determining part receives said cell origin after-modification logical connection information as said after-modification logical connection information, and directly obtains said logical connection information from placement and routing information containing all information about placement and routing, said signal origin logical connection information sampling part outputs, as said signal origin logical connection information, signal origin after-modification logical connection information based on said after-modification logical connection information, and said rerouting signal determining part receives said signal origin after-modification logical connection information as said after-modification logical connection information, and directly obtains said original logical connection information from said placement and routing information.

5. The automatic placement and routing apparatus according to claim 1 further comprising:

a mismatch cell and mismatch signal determining part that compares placement and routing information containing all information about placement and routing with said after-modification logical connection information, and determines a match and a mismatch between the two information, and then outputs mismatch information about a mismatch cell and a mismatch signal, each of which has a mismatch in information, wherein said cell origin logical connection information sampling part receives together said original logical connection information and said mismatch information, and outputs, as said cell origin logical connection information, cell origin original logical connection information based on said after-modification logical connection information, and cell origin after-modification logical connection information based on said after-modification logical connection information, said cell origin original logical connection information and said cell origin after-modification logical connection information are information only about said mismatch cell contained in said mismatch information, said replacement cell determining part receives said cell origin after-modification logical connection information as said after-modification logical connection information, and receives said cell origin original logical connection information as said logical connection information, said signal origin logical connection information sampling part receives together said logical connection information and said mismatch information, and outputs, as said signal origin logical connection information, signal origin original logical connection information based on said logical connection information, and signal origin after-modification logical connection information based on said after-modification logical connection information, said signal origin original logical connection information and said signal origin after-modification logical connection information are information only about said mismatch signal contained in said mismatch information, and said rerouting signal determining part receives said signal origin after-modification logical connection information as said after-modification logical connection information, and receives said signal origin original logical connection information as said logical connection information.

6. The automatic placement and routing apparatus according to claim 2 wherein said replacement cell determining part receives information of determination processing result in said rerouting signal determining part and processes, as match, a signal that is not handled as said rerouting signal in said rerouting signal determining part, even for a mismatch in said signal name between said after-modification logical connection information and said logical connection information, and said rerouting signs determining part receives information of determination processing result in said replacement cell determining part and processes, as match, a cell that is not handled as said replacement cell in said replacement cell determining part, even for a mismatch in said cell identification name between said after-modification logical connection information and said original logical connection information.

* * * * *